United States Patent
Maltsev et al.

(10) Patent No.: US 10,938,498 B2
(45) Date of Patent: Mar. 2, 2021

(54) APPARATUS, SYSTEM AND METHOD OF TRANSMITTING A PPDU

(71) Applicant: INTEL IP CORPORATION, Santa Clara, CA (US)

(72) Inventors: Alexander Maltsev, Nizhny Novgorod (RU); Carlos Cordeiro, Portland, OR (US); Artyom Lomayev, Nizhny Novgorod (RU); Michael Genossar, Modiin (IL); Claudio Da Silva, Portland, OR (US)

(73) Assignee: INTEL IP CORPORATION, Santa Clara, CA (US)

(*) Notice: Subject to any disclaimer, the term of this patent is extended or adjusted under 35 U.S.C. 154(b) by 0 days.

(21) Appl. No.: 16/626,463

(22) PCT Filed: Jun. 21, 2018

(86) PCT No.: PCT/US2018/038744
§ 371 (c)(1),
(2) Date: Dec. 24, 2019

(87) PCT Pub. No.: WO2019/005574
PCT Pub. Date: Jan. 3, 2019

(65) Prior Publication Data
US 2020/0228224 A1    Jul. 16, 2020

Related U.S. Application Data

(60) Provisional application No. 62/524,552, filed on Jun. 25, 2017, provisional application No. 62/547,982, (Continued)

(51) Int. Cl.
*H04J 13/00*    (2011.01)
*H03M 13/11*    (2006.01)
(Continued)

(52) U.S. Cl.
CPC ......... *H04J 13/0014* (2013.01); *H03M 13/11* (2013.01); *H04L 1/0061* (2013.01); *H04L 27/2605* (2013.01)

(58) Field of Classification Search
CPC ... H04L 1/0071; H04L 1/0057; H04L 1/0061; H04L 5/0023; H04L 1/0618; H04L 1/00;
(Continued)

(56) References Cited

U.S. PATENT DOCUMENTS

2017/0033958 A1    2/2017    Eitan et al.
2017/0048095 A1    2/2017    Sun et al.
(Continued)

OTHER PUBLICATIONS

International Preliminary Report on Patentability for International Application No. PCT/US2018/038744, dated Jan. 9, 2020, 10 pages.
(Continued)

*Primary Examiner* — Leila Malek
(74) *Attorney, Agent, or Firm* — Shichrur & Co.

(57) ABSTRACT

An apparatus of a transmitter may include, for example, a Golay builder to build modulated Golay sequences for at least a non-EDMG Short Training Field (L-STF), and a non-EDMG Channel Estimation Field (L-CEF) of a PPDU; a scrambler to generate scrambled bits by scrambling bits of a non-EDMG header (L-header) and a data field of the PPDU; an encoder to encode the scrambled bits into encoded bits according to a low-density parity-check (LDPC) code; a constellation mapper to map the encoded bits into a stream of constellation points according to a constellation scheme; a spreader to spread the stream of constellation points according to a Golay sequence; and a transmit chain mapper to map a bit stream output from the Golay builder and the spreader to a plurality of transmit chains by applying a spatial expansion with relative cyclic shift over the plurality of transmit chains.

25 Claims, 11 Drawing Sheets

Related U.S. Application Data filed on Aug. 21, 2017, provisional application No. 62/576,473, filed on Oct. 24, 2017.

(51) Int. Cl.
*H04L 1/00* (2006.01)
*H04L 27/26* (2006.01)

(58) Field of Classification Search
CPC ..... H04L 1/0041; H04L 1/06; H04L 27/2602; H04L 27/36; H04L 5/00; H04L 5/0053; H04J 13/0014; H04B 7/0617; H04B 7/02; H04W 84/12
USPC .......................................................... 375/295
See application file for complete search history.

(56) References Cited

U.S. PATENT DOCUMENTS

| | | | |
|---|---|---|---|
| 2017/0280354 A1* | 9/2017 | Huang | H04L 1/0081 |
| 2019/0150117 A1* | 5/2019 | Lou | H04B 7/0452 370/329 |
| 2019/0288763 A1 | 9/2019 | Oteri et al. | |
| 2020/0322078 A1 | 10/2020 | Maltsev et al. | |

OTHER PUBLICATIONS

International Search Report and the Written Opinion for International Application No. PCT/US2018/038744, dated Oct. 23, 2018, 13 pages.

Intel, '30.5.2 Transmitter Block Diagram for SC Mode', doc.: IEEE802.11-17/0752r0, May 7, 2017, 7 pages.

Intel, 'Proposed Comment Resolution for CID 63, 68 in 11ay', doc.: IEEE802.11-17/0893r1, Jun. 7, 2017, 9 pages.

Intel, '30.5.6.4.4 Block Interleaver for SC Mode', doc.: IEEE802.11-17/0588r0, Apr. 11, 2017, 4 pages.

IEEE Std 802.11™-2016. IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016, 3534 pages.

Office Action for U.S. Appl. No. 16/907,244, dated Oct. 29, 2020, 24 pages.

* cited by examiner

APPARATUS, SYSTEM AND METHOD OF TRANSMITTING A PPDU

CROSS REFERENCE

This application claims the benefit of and priority from U.S. Provisional Patent Application No. 62/524,552 entitled "Apparatus, System and Method of Transmitting a PPDU", filed Jun. 25, 2017, U.S. Provisional Patent Application No. 62/547,982 entitled "Apparatus, System and Method of Transmitting a PPDU", filed Aug. 21, 2017, and U.S. Provisional Patent Application No. 62/576,473 entitled "Orthogonal Frequency-Division Multiplexing (OFDM) Interleaver for Vertical Multiple-Input Multiple-Output (MIMO) Coding", filed Oct. 24, 2017, the entire disclosures of which are incorporated herein by reference.

TECHNICAL FIELD

Embodiments described herein generally relate to transmitting a Physical Layer Protocol Data Unit (PPDU).

BACKGROUND

A wireless communication network in a millimeter-wave band may provide high-speed data access for users of wireless communication devices.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
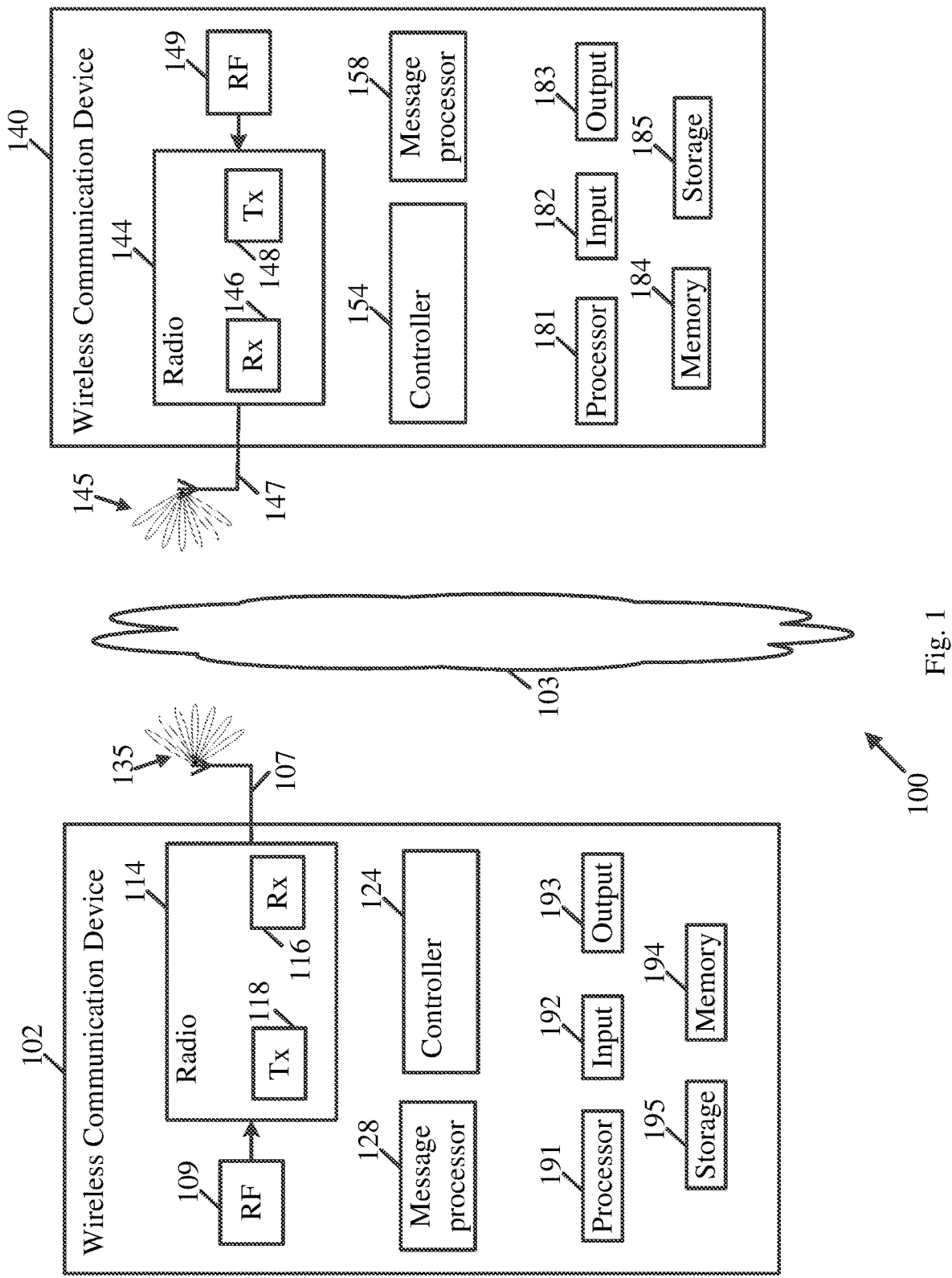
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016); and/or IEEE 802.11ay (P802.11ay/D1.0 Draft Standard for Information Technology—Telecommunications and Information Exchange Between Systems—Local and Metropolitan Area Networks—Specific Requirements Part 11: Wireless LAN Medium Access Control (MAC) and Physical Layer (PHY) Specifications Amendment 7: Enhanced Throughput for Operation in License Exempt Bands Above 45 GHz, November 2017)) and/or future versions and/or derivatives thereof, devices and/or networks operating in accordance with existing WFA Peer-to-Peer (P2P) specifications (WiFi P2P technical specification, version 1.7, Jul. 6, 2016) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band above 45 Gigahertz (GHz), e.g., 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHz, a frequency band above 45 GHz, a 5G frequency band, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., at least 7 Gigabit per second, at least 30 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a wireless communication device 102, a wireless communication device 140, and/or one more other devices.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multipurpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SD- RAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, wireless communication devices 102 and/or 140 may be capable of communicating content, data, information and/or signals via a wireless medium (WM) 103. In some demonstrative embodiments, wireless medium 103 may include, for example, a radio channel, a cellular channel, an RF channel, a WiFi channel, a 5G channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG channels. In other embodiments WM 103 may include any other directional channels.

In other embodiments, WM 103 may include any other type of channel over any other frequency band.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 146 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, a 5G band, and/or any other band, for example, a 2.4 GHz band, a 5 GHz band, a S1G band, and/or any other band.

In some demonstrative embodiments, radios 114 and/or 144 may include, or may be associated with one or more, e.g., a plurality of, directional antennas.

In some demonstrative embodiments, device 102 may include one or more, e.g., a plurality of, directional antennas 107, and/or device 140 may include on or more, e.g., a plurality of, directional antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include directional antennas, which may be steered to one or more beam directions. For example, antennas 107 may be steered to one or more beam directions 135, and/or antennas 147 may be steered to one or more beam directions 145.

In some demonstrative embodiments, antennas 107 and/or 147 may include and/or may be implemented as part of a single Phased Antenna Array (PAA).

In some demonstrative embodiments, antennas 107 and/or 147 may be implemented as part of a plurality of PAAs, for example, as a plurality of physically independent PAAs.

In some demonstrative embodiments, a PAA may include, for example, a rectangular geometry, e.g., including an integer number, denoted M, of rows, and an integer number, denoted N, of columns. In other embodiments, any other types of antennas and/or antenna arrays may be used.

In some demonstrative embodiments, antennas 107 and/or antennas 147 may be connected to, and/or associated with, one or more Radio Frequency (RF) chains.

In some demonstrative embodiments, device 102 may include one or more, e.g., a plurality of, RF chains 109 connected to, and/or associated with, antennas 107.

In some demonstrative embodiments, one or more of RF chains 109 may be included as part of, and/or implemented as part of one or more elements of radio 114, e.g., as part of transmitter 118 and/or receiver 116.

In some demonstrative embodiments, device 140 may include one or more, e.g., a plurality of, RF chains 149 connected to, and/or associated with, antennas 147.

In some demonstrative embodiments, one or more of RF chains 149 may be included as part of, and/or implemented as part of one or more elements of radio 144, e.g., as part of transmitter 148 and/or receiver 146.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein. In one example, controller 124 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein. In one example, controller 154 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In one example, message processor 128 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 128 may be configured to perform any other additional or alternative functionality and/or may include any other additional or alternative components to generate and/or process a message to be transmitted.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In one example, message processor 158 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other embodiments, message processor 158 may be configured to perform any other additional or alternative functionality and/or may include any other additional or alternative components to generate and/or process a message to be transmitted.

In some demonstrative embodiments, message processors 128 and/or 158 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, BB circuitry and/or logic, a BB processor, a BB memory, AP circuitry and/or logic, an AP processor, an AP memory, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114.

In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144.

In one example, controller 154, message processor 158, and radio 144 may be implemented as part of the chip or SoC.

In other embodiments, controller 154, message processor 158 and/or radio 144 may be implemented by one or more additional or alternative elements of device 140.

In some demonstrative embodiments, device 102 and/or device 140 may include, operate as, perform the role of, and/or perform one or more functionalities of, one or more STAs. For example, device 102 may include at least one STA, and/or device 140 may include at least one STA.

In some demonstrative embodiments, device 102 and/or device 140 may include, operate as, perform the role of, and/or perform one or more functionalities of, one or more DMG STAs. For example, device 102 may include, operate as, perform the role of, and/or perform one or more functionalities of, at least one DMG STA, and/or device 140 may include, operate as, perform the role of, and/or perform one or more functionalities of, at least one DMG STA.

In other embodiments, devices 102 and/or 140 may include, operate as, perform the role of, and/or perform one or more functionalities of, any other wireless device and/or station, e.g., a WLAN STA, a WiFi STA, and the like.

In some demonstrative embodiments, device 102 and/or device 140 may be configured operate as, perform the role of, and/or perform one or more functionalities of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, perform the role of, and/or perform one or more functionalities of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may operate as, perform the role of, and/or perform one or more functionalities of, any other additional or alternative device and/or station.

In one example, a station (STA) may include a logical entity that is a singly addressable instance of a medium access control (MAC) and physical layer (PHY) interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments devices 102 and/or 140 may be configured to communicate over a Next Generation 60 GHz (NG60) network, an Enhanced DMG (EDMG) network, and/or any other network. For example, devices 102 and/or 140 may perform Multiple-Input-Multiple-Output (MIMO) communication, for example, for communicating over the NG60 and/or EDMG networks, e.g., over an NG60 or an EDMG frequency band.

In some demonstrative embodiments, devices 102 and/or 140 may be configured to operate in accordance with one or more Specifications, for example, including one or more IEEE 802.11 Specifications, e.g., an IEEE 802.11-2016 Specification, an IEEE 802.11ay Specification, and/or any other specification and/or protocol.

Some demonstrative embodiments may be implemented, for example, as part of a new standard in an mmWave band, e.g., a 60 GHz frequency band or any other directional band, for example, as an evolution of an IEEE 802.11-2016 Specification and/or an IEEE 802.11ad Specification.

In some demonstrative embodiments, devices 102 and/or 140 may be configured according to one or more standards, for example, in accordance with an IEEE 802.11ay Standard, which may be, for example, configured to enhance the efficiency and/or performance of an IEEE 802.11.ad Specification, which may be configured to provide Wi-Fi connectivity in a 60 GHz band.

Some demonstrative embodiments may enable, for example, to significantly increase the data transmission rates defined in the IEEE 802.11ad Specification, for example, from 7 Gigabit per second (Gbps), e.g., up to 30 Gbps, or to any other data rate, which may, for example, satisfy growing demand in network capacity for new coming applications.

Some demonstrative embodiments may be implemented, for example, to allow increasing a transmission data rate, for example, by applying MIMO and/or channel bonding techniques.

In some demonstrative embodiments, devices 102 and/or 140 may be configured to communicate MIMO communications over the mmWave wireless communication band.

In some demonstrative embodiments, device 102 and/or device 140 may be configured to support one or more mechanisms and/or features, for example, channel bonding, Single User (SU) MIMO, and/or Multi-User (MU) MIMO, for example, in accordance with an IEEE 802.11ay Standard and/or any other standard and/or protocol.

In some demonstrative embodiments, device 102 and/or device 140 may include, operate as, perform a role of, and/or perform the functionality of, one or more EDMG STAs. For example, device 102 may include, operate as, perform a role of, and/or perform the functionality of, at least one EDMG STA, and/or device 140 may include, operate as, perform a role of, and/or perform the functionality of, at least one EDMG STA.

In some demonstrative embodiments, devices 102 and/or 140 may implement a communication scheme, which may include Physical layer (PHY) and/or Media Access Control (MAC) layer schemes, for example, to support one or more applications, and/or increased transmission data rates, e.g., data rates of up to 30 Gbps, or any other data rate.

In some demonstrative embodiments, the PHY and/or MAC layer schemes may be configured to support frequency channel bonding over a mmWave band, e.g., over a 60 GHz band, SU MIMO techniques, and/or MU MIMO techniques.

In some demonstrative embodiments, devices 102 and/or 140 may be configured to implement one or more mechanisms, which may be configured to enable SU and/or MU communication of Downlink (DL) and/or Uplink frames (UL) using a MIMO scheme.

In some demonstrative embodiments, device 102 and/or device 140 may be configured to implement one or more MU communication mechanisms. For example, devices 102 and/or 140 may be configured to implement one or more MU mechanisms, which may be configured to enable MU communication of DL frames using a MIMO scheme, for example, between a device, e.g., device 102, and a plurality of devices, e.g., including device 140 and/or one or more other devices.

In some demonstrative embodiments, devices 102 and/or 140 may be configured to communicate over an NG60 network, an EDMG network, and/or any other network and/or any other frequency band. For example, devices 102 and/or 140 may be configured to communicate DL MIMO transmissions and/or UL MIMO transmissions, for example, for communicating over the NG60 and/or EDMG networks.

Some wireless communication Specifications, for example, the IEEE 802.11ad-2012 Specification, may be configured to support a SU system, in which a STA may transmit frames to a single STA at a time. Such Specifications may not be able, for example, to support a STA transmitting to multiple STAs simultaneously, for example, using a MU-MIMO scheme, e.g., a DL MU-MIMO, or any other MU scheme.

In some demonstrative embodiments, devices 102 and/or 140 may be configured to communicate over a channel bandwidth, e.g., of at least 2.16 GHz, in a frequency band above 45 GHz.

In some demonstrative embodiments, devices 102 and/or 140 may be configured to implement one or more mechanisms, which may, for example, enable to extend a single-channel BW scheme, e.g., a scheme in accordance with the IEEE 802.11ad Specification or any other scheme, for higher data rates and/or increased capabilities, e.g., as described below.

In one example, the single-channel BW scheme may include communication over a 2.16 GHz channel (also referred to as a "single-channel" or a "DMG channel").

In some demonstrative embodiments, devices 102 and/or 140 may be configured to implement one or more channel bonding mechanisms, which may, for example, support communication over a channel BW (also referred to as a "wide channel", an "EDMG channel", or a "bonded channel") including two or more channels, e.g., two or more 2.16 GHz channels, e.g., as described below.

In some demonstrative embodiments, the channel bonding mechanisms may include, for example, a mechanism and/or an operation whereby two or more channels, e.g., 2.16 GHz channels, can be combined, e.g., for a higher bandwidth of packet transmission, for example, to enable achieving higher data rates, e.g., when compared to transmissions over a single channel. Some demonstrative embodiments are described herein with respect to communication over a channel BW including two or more 2.16 GHz channels, however other embodiments may be implemented with respect to communications over a channel bandwidth, e.g., a "wide" channel, including or formed by any other number of two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, a channel BW of 8.64 GHz, and/or any other additional or alternative channel BW, e.g., as described below.

In some demonstrative embodiments, device 102 and/or device 140 may be configured to implement one or more channel bonding mechanisms, which may, for example, support an increased channel bandwidth, for example, a channel BW of 4.32 GHz, e.g., including two 2.16 Ghz channels according to a channel bonding factor of two, a channel BW of 6.48 GHz, e.g., including three 2.16 Ghz channels according to a channel bonding factor of three, a channel BW of 8.64 GHz, e.g., including four 2.16 Ghz channels according to a channel bonding factor of four, and/or any other additional or alternative channel BW, e.g., including any other number of 2.16 Ghz channels and/or according to any other channel bonding factor.

In some demonstrative embodiments, device 102 and/or device 140 may be configured to communicate one or more transmissions over one or more channel BWs, for example, including a channel BW of 2.16 GHz, a channel BW of 4.32 GHz, a channel BW of 6.48 GHz, a channel BW of 8.64 GHz and/or any other channel BW.

In some demonstrative embodiments, introduction of MIMO may be based, for example, on implementing robust transmission modes and/or enhancing the reliability of data transmission, e.g., rather than the transmission rate, compared to a Single Input Single Output (SISO) case. For example, one or more Space Time Block Coding (STBC) schemes utilizing a space-time channel diversity property may be implemented to achieve one or more enhancements for the MIMO transmission.

In some demonstrative embodiments, devices 102 and/or 140 may be configured to generate, process, transmit and/or receive a Physical Layer (PHY) Protocol Data Unit (PPDU) having a PPDU format (also referred to as "EDMG PPDU format"), which may be configured, for example, for communication between EDMG stations, e.g., as described below.

In some demonstrative embodiments, a PPDU, e.g., an EDMG PPDU, may include at least one non-EDMG fields, e.g., a legacy field, which may be identified, decodable, and/or processed by one or more devices ("non-EDMG devices", or "legacy devices"), which may not support one or more features and/or mechanisms ("non-legacy" mechanisms or "EDMG mechanisms"). For example, the legacy devices may include non-EDMG stations, which may be, for example, configured according to an IEEE 802.11-2016 Standard, and the like. For example, a non-EDMG station may include a DMG station, which is not an EDMG station.

Figure 2:
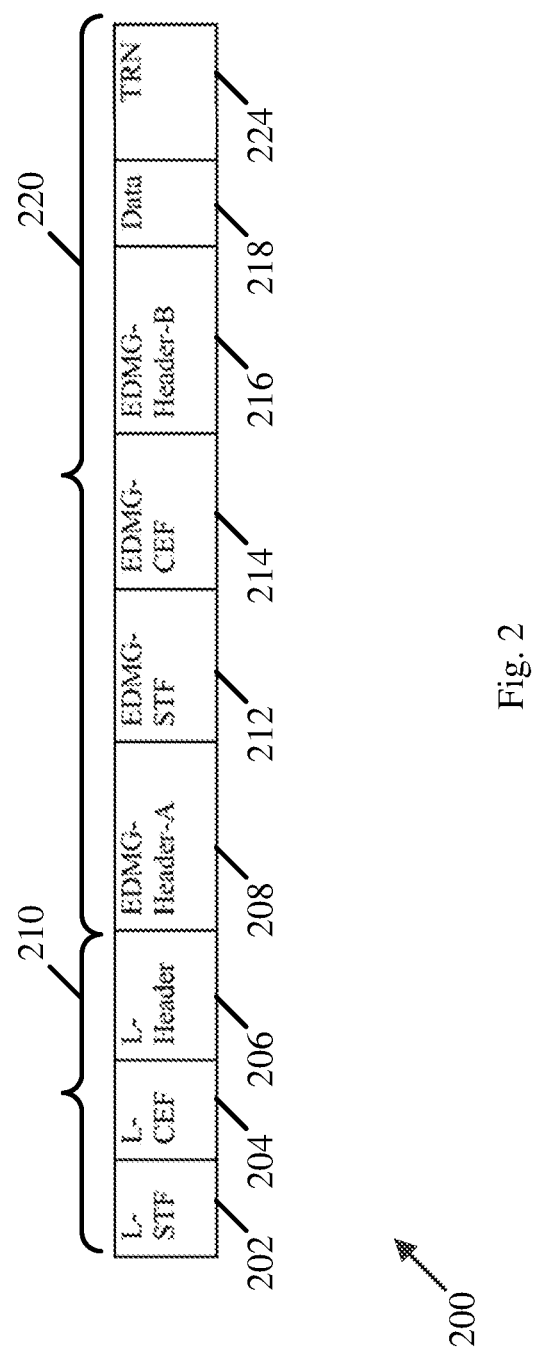
FIG. 2 is a schematic illustration of an Enhanced Directional Multi-Gigabit (EDMG) Physical Layer Protocol Data Unit (PPDU) format, which may be implemented in accordance with some demonstrative embodiments.

Reference is made to FIG. 2, which schematically illustrates an EDMG PPDU format 200, which may be implemented in accordance with some demonstrative embodiments. In one example, devices 102 (FIG. 1) and/or 140 (FIG. 1) may be configured to generate, transmit, receive and/or process one or more EDMG PPDUs having the structure and/or format of EDMG PPDU 200.

In one example, devices 102 (FIG. 1) and/or 140 (FIG. 1) may communicate PPDU 200, for example, as part of a transmission over a channel, e.g., an EDMG channel, having a channel bandwidth including one or more 2.16 GHz channels, for example, including a channel BW of 2.16 GHz, a channel BW of 4.32 GHz, a channel BW of 6.48 GHz, a channel BW of 8.64 GHz, and/or any other channel BW, e.g., as described below.

In some demonstrative embodiments, as shown in FIG. 2, EDMG PPDU 200 may include a non-EDMG portion 210 ("legacy portion"), e.g., as described below.

In some demonstrative embodiments, as shown in FIG. 2, non-EDMG portion 210 may include a non-EDMG (legacy) Short Training Field (STF) (L-STF) 202, a non-EDMG (Legacy) Channel Estimation Field (CEF) (L-CEF) 204, and/or a non-EDMG header (L-header) 206.

In some demonstrative embodiments, as shown in FIG. 2, EDMG PPDU 200, may include an EDMG portion 220, for example, following non-EDMG portion 210, e.g., as described below.

In some demonstrative embodiments, as shown in FIG. 2, EDMG portion 220 may include a first EDMG header, e.g., an EDMG-Header-A 208, an EDMG-STF 212, an EDMG-CEF 214, a second EDMG header, e.g., an EDMG-Header-B 216, a Data field 218, and/or one or more beamforming training fields, e.g., a TRN field 224.

In some demonstrative embodiments, EDMG portion 220 may include some or all of the fields shown in FIG. 2 and/or one or more other additional or alternative fields.

Referring back to FIG. 1, in some demonstrative embodiments, devices 102 and/or 140 may be configured to generate, transmit, receive and/or process one or more transmissions, e.g., including one or more non-EDMG PPDUs and/or EDMG PPDUs, e.g., as described below.

In some demonstrative embodiments, devices 102 and/or 140 may be configured to generate, transmit, receive and/or process one or more transmissions of PPDUs, for example, non-EDMG PPDUs and/or EDMG PPDUs, for example, for Control PHY (Control mode), e.g., in accordance with an IEEE 802.11ay Specification and/or any other specification.

In some demonstrative embodiments, devices 102 and/or 140 may be configured to generate, transmit, receive and/or process one or more transmissions of control mode PPDUs, for example, non-EDMG Control mode PPDUs and/or EDMG Control mode PPDUs, e.g., as described below.

Some demonstrative embodiments are described herein with respect to communicating control mode PPDUs. In other embodiments, one or more of the operations and/or communications may be implemented with respect to communication of any other type of PPDUs.

In some demonstrative embodiments, devices 102 and/or 140 may be configured to generate, transmit, receive and/or process one or more transmissions of the PPDUs, for example, by transmission over a 2.16 GHz bandwidth, a 4.32 GHz bandwidth, a 6.48 GHz bandwidth, a 8.64 GHz bandwidth, and/or any other bandwidth.

In some demonstrative embodiments, devices 102 and/or 140 may be configured to generate, transmit, receive and/or process a non-EDMG PPDU and/or an EDMG PPDU transmission over a 2.16 GHz channel, a 4.32 GHz channel, a 6.48 GHz channel, a 8.64 GHz channel, and/or any other channel bandwidth, for example, using $N_{TX}$ transmit chains, e.g., as described below.

In some demonstrative embodiments, devices 102 and/or 140 may be configured to generate, transmit, receive and/or process a non-EDMG PPDU, which may be configured according to a non-EDMG PPDU format, which may be, for example, received and/or decoded by both DMG STAs ("legacy DMG stations") and EDMG STAs ("new STAs").

In some demonstrative embodiments, the non-EDMG PPDU format may include, for example, a non-EDMG portion, e.g., non-EDMG portion 210 (FIG. 2), which may be followed by a data field, and a TRN field. For example, the non-EDMG portion may include a non-EDMG STF, e.g., L-STF 202 (FIG. 2), a non-EDMG CEF, e.g., L-CEF 204, and/or a non-EDMG header, e.g., L-header 206 (FIG. 2).

In some demonstrative embodiments, the EDMG PPDU format may include one or more EDMG fields, for example, one or more fields of EDMG portion 220 (FIG. 2), which may be intended for, e.g., receivable by and/or decodable by, EDMG STAs, for example, only EDMG STAs. For example, non-EDMG STAs, e.g., DMG STAs, may be able to decode an L-Header of the EDMG PPDU, for example, to extract a Modulation and Coding Scheme (MCS) and/or a PHY Service Data Unit (PSDU) length and/or any other information, for example, to update a NAV counter.

In some demonstrative embodiments, a Control mode EDMG PPDU may include, for example, a preamble, a data field, e.g., data field 218 (FIG. 2), and a TRN field, e.g., TRN field 224 (FIG. 2).

In some demonstrative embodiments, the preamble for the Control mode EDMG PPDU may include, for example, an L-STF, e.g., L-STF 202 (FIG. 2), an L-CEF, e.g., L-CEF 204 (FIG. 2), an L-Header, e.g., L-Header 206 (FIG. 2), and/or an EDMG Header-A, e.g., EDMG Header A 208 (FIG. 2).

In some demonstrative embodiments, devices 102 and/or 140 may implement one or more elements and/or functionalities according to a transmitter architecture, which may be configured, for example, to transmit one or more types of PPDUs, for example, at least non-EDMG Control mode PPDUs and/or EDMG Control mode PPDUs, e.g., as described below.

In some demonstrative embodiments, the transmitter architecture may be configured, for example, to perform transmission of the PPDUs, for example, over a 2.16 GHz channel, a 4.32 GHz channel, a 6.48 GHz channel, an 8.64

GHz channel, and/or any other channel bandwidth, for example, using $N_{TX}$ transmit chains, e.g., as described below.

In some demonstrative embodiments, the transmitter architecture may be configured, for example, to implement a diversity scheme, for example, a Cyclic Shift Diversity (CSD) scheme, to transmit the same signal over different transmit chains, for example, with a cyclic shift, e.g., as described below.

In some demonstrative embodiments, the transmitter architecture may be configured, for example, to use a duplicate transmission mode to transmit over a 4.32 GHz channel, a 6.48 GHz channel, an 8.64 GHz channel, and/or any other channel bandwidth, for example, by duplicating the transmission over a plurality of 2.16 GHz channels.

In some demonstrative embodiments, Control mode PPDU transmissions, for example, an EDMG Control mode PPDU transmission and/or a non-EDMG Control mode PPDU transmission, may be generated using a transmitter architecture including one or more blocks, elements, components, and/or modules, e.g., as described below.

In some demonstrative embodiments, the transmitter architecture may include a scrambler, which may be configured to scramble data, for example, according to a scrambling scheme, which may be configured to reduce the probability of long sequences of 0s and 1s, e.g., in accordance with an IEEE 802.11ay Specification and/or any other Specification.

In some demonstrative embodiments, the transmitter architecture may include a Low Density Parity Check (LDPC) encoder, which may be configured to encode the data, for example, to allow error correction. In one example, the LDPC encoder may be configured to perform bit padding, for example, to provide an integer number of codewords, e.g., in accordance with an IEEE 802.11ay Specification and/or any other Specification.

In some demonstrative embodiments, the transmitter architecture may include constellation mapper, which may be configured to map a sequence of bits to constellation points, e.g., in accordance with an IEEE 802.11ay Specification and/or any other Specification.

In some demonstrative embodiments, the transmitter architecture may include a spreader, which may be configured to spread out a single constellation point to a plurality of chips, e.g., 32 chips or any other number of chips, for example, by applying a Golay sequence, e.g., a Golay sequence Ga, of a length 32 or any other length, e.g., in accordance with an IEEE 802.11ay Specification and/or any other Specification.

In some demonstrative embodiments, the transmitter architecture may include a Golay builder, which may be configured to generate and/or build modulated Golay sequences, for example, $\pi/2$-BPSK modulated Ga and/or Gb Golay sequences, which may form and/or be included in, for example, the L-STF, L-CEF, and/or TRN units, e.g., in accordance with an IEEE 802.11ay Specification and/or any other Specification.

In some demonstrative embodiments, the transmitter architecture may include a Cyclic shift (CSD) inserter, which may be configured, for example, to apply a cyclic shift, for example, to prevent the signal from unintentional beamforming. A cyclic shift may be specified, for example, per transmitter chain, for example, for non-EDMG duplicate PPDU transmission and/or EDMG PPDU transmission, e.g., as described below.

In some demonstrative embodiments, the transmitter architecture may include a pulse shaper, which may be configured to perform convolution of constellation points with a shape filter impulse response, for example, with a possible sampling rate change. For example, for duplicate channel transmission, pulse shaping may include a relative time delay between the primary and secondary channels. The exact definition of shape filter impulse response may be, for example, implementation specific.

In some demonstrative embodiments, transmitters 118 and/or 148 may implement one or more elements, blocks, components, and/or modules of a transmitter architecture, which may be configured to transmit at least one or more types of PPDUs, e.g., as described below.

In some demonstrative embodiments, one or more elements and/or functionalities of transmitter 118 may be implemented by controller 124 and/or message processor 128.

In some demonstrative embodiments, transmitter 118 may be configured to transmit a PPDU, e.g., EDMG PPDU 200 (FIG. 2) or any other PPDU, via a plurality of transmit chains in a channel bandwidth over a frequency band above 45 GHz, e.g., as described below.

In other embodiments, transmitter 118 may transmit the PPDU over any other frequency band.

In some demonstrative embodiments, transmitter 118 may be configured to transmit the PPDU, e.g., EDMG PPDU 200 (FIG. 2) or any other PPDU, over a channel bandwidth of 2.16 GHz, 4.32 GHz, 6.48 GHz, or 8.64 GHz, e.g., as described below.

In other embodiments, transmitter 118 may transmit the PPDU over any other channel bandwidth.

In some demonstrative embodiments, transmitter 118 may include, for example, a Golay builder, which may be configured to build modulated Golay sequences for at least a non-EDMG STF of the PPDU, for example, L-STF 202 (FIG. 2), and/or a non-EDMG CEF of the PPDU, for example, L-CEF 204 (FIG. 2), e.g., as described below.

In some demonstrative embodiments, transmitter 118 may include, for example, a scrambler, which may be configured to generate scrambled bits, for example, by scrambling bits of a non-EDMG header (L-header) of the PPDU, for example, L-header 206 (FIG. 2), and a data field of the PPDU, for example, data field 218 (FIG. 2), e.g., as described below.

In some demonstrative embodiments, transmitter 118 may include, for example, an encoder, which may be configured to encode the scrambled bits into encoded bits according to a low-density parity-check (LDPC) code, e.g., as described below.

In some demonstrative embodiments, transmitter 118 may include, for example, a constellation mapper, which may be configured to map the encoded bits into a stream of constellation points, for example, according to a constellation scheme, e.g., as described below.

In some demonstrative embodiments, transmitter 118 may include, for example, a spreader, which may be configured to spread the stream of constellation points, for example, according to a Golay sequence, e.g., as described below.

In some demonstrative embodiments, transmitter 118 may include, for example, a transmit chain mapper, which may be configured to map a bit stream output from the Golay builder and the spreader to a plurality of transmit chains, for example, by applying a spatial expansion with relative cyclic shift over the plurality of transmit chains, e.g., as described below.

In some demonstrative embodiments, transmitter 118 may include, for example, one or more cyclic shifters, which may be configured to apply the CSD between the plurality of transmit chains, e.g., as described below.

In some demonstrative embodiments, the Golay builder may be configured to build one or more TRN units of the PPDU, e.g., as described below.

In some demonstrative embodiments, the PPDU may include a non-EDMG PPDU decodable by one or more non-EDMG stations, which may be, for example, DMG stations, e.g., as described below.

In some demonstrative embodiments, the relative cyclic shift may be applied to one or more TRN units of the PPDU, e.g., as described below.

In some demonstrative embodiments, the PPDU may include an EDMG PPDU, e.g., EDMG PPDU 200 (FIG. 2), including at least an EDMG Header (EDMG Header A), e.g., EDMG Header A 208 (FIG. 2), decodable, for example, by EDMG stations, e.g., as described below.

In some demonstrative embodiments, transmitter 118 may be configured to map the L-CEF, the L-STF, the L-Header, the EDMG Header A, and the data field of the EDMG PPDU to the plurality of transmit chains, for example, with the relative cyclic shift, e.g., as described below.

In some demonstrative embodiments, transmitter 118 may be configured to map the one or more TRN units of the EDMG PPDU to the plurality of transmit chains, for example, without the relative cyclic shift, e.g., as described below.

For example, transmitter 118 may map L-CEF 204, L-STF 202, L-Header 206, EDMG Header A 208, and data field 218 (FIG. 2) to the plurality of transmit chains, e.g., with the relative cyclic shift, and may map the one or more TRN units of TRN field 224 (FIG. 2) to the plurality of transmit chains, e.g., without the relative cyclic shift.

In some demonstrative embodiments, transmitter 118 may be configured to map to each transmit chain its own TRN unit, e.g., as described below.

In some demonstrative embodiments, the scrambler may be configured to generate the scrambled bits, for example, by scrambling bits of the EDMG Header A, for example, EDMG Header A 208 (FIG. 2), for example, when the PPDU includes the EDMG PPDU, e.g., as described below.

In some demonstrative embodiments, the Golay builder may be configured to build it/2 Binary Phase Shift Keying (BPSK) modulated Golay sequences including the L-STF and L-CEF, for example, L-STF 202 and L-CEF 204 (FIG. 2), e.g., as described below.

In other embodiments, the Golay builder may build the Golay sequences modulated according to any other modulation scheme.

In some demonstrative embodiments, the spreader may be configured to spread the stream of constellation points, for example, according to a Golay sequence of length 32, e.g., as described below.

In other embodiments, the spreader may spread the stream of constellation points according to any other sequence of any other length.

In some demonstrative embodiments, the PPDU may include a control mode PPDU, e.g., as described above.

In other embodiments, the PPDU may include any other type of PPDU.

Figure 3:
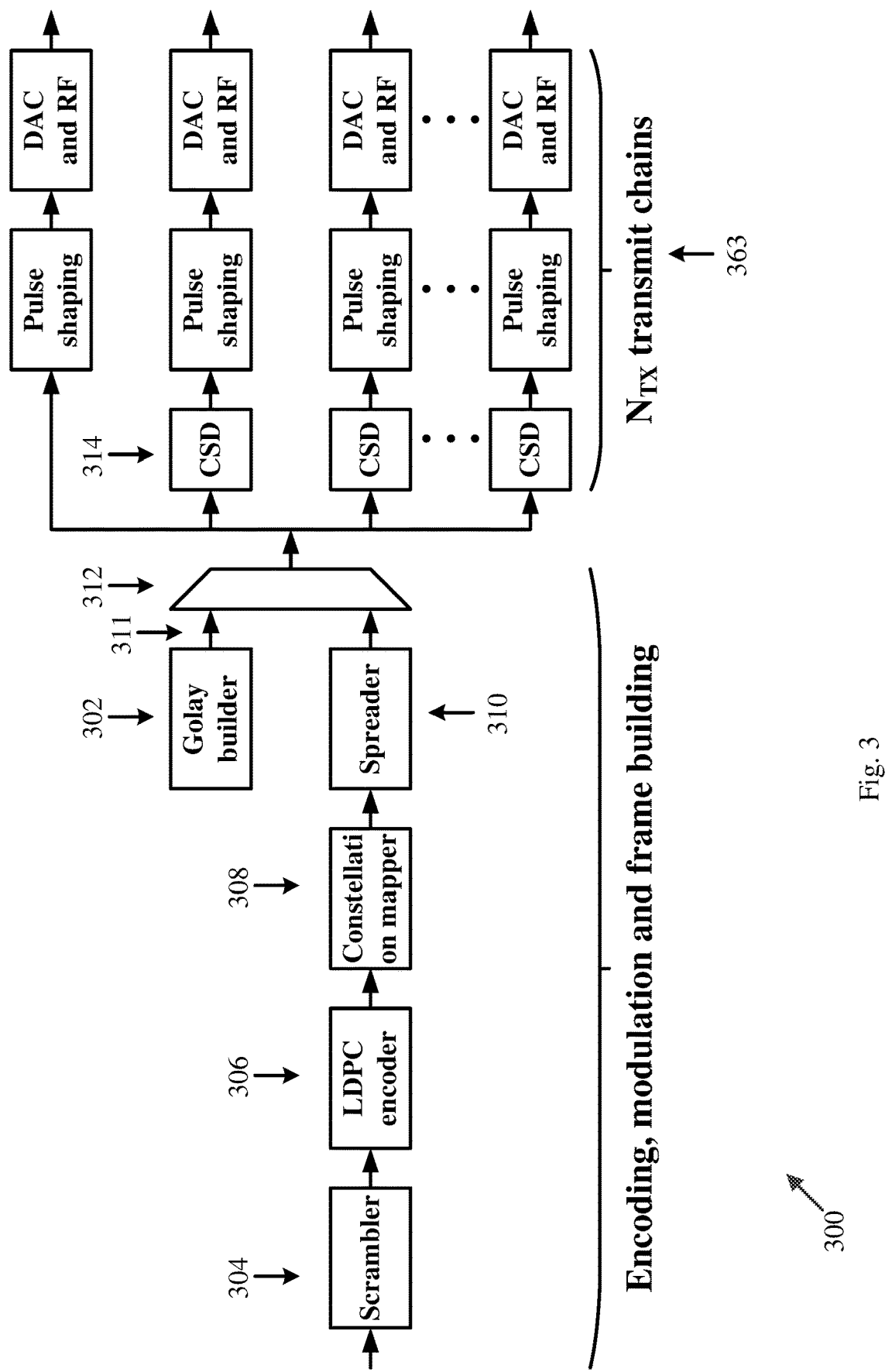
FIG. 3 is a schematic illustration of a transmitter architecture, in accordance with some demonstrative embodiments.

Reference is made to FIG. 3, which schematically illustrates a block diagram of a transmitter architecture 300, in accordance with some demonstrative embodiments.

For example, transmitter 118 (FIG. 1) may be configured to implement one or more elements and/or functionalities of transmitter architecture 300.

For example, transmitter 118 (FIG. 1) may include circuitry and/or logic configured to perform one or more functionalities and/or operations of one or more elements of transmitter architecture 300.

In some demonstrative embodiments, one or more elements and/or blocks of transmitter architecture 300 may be configured, for example, for non-EDMG PPDU transmission, e.g., as described below.

In some demonstrative embodiments, one or more elements and/or blocks of transmitter architecture 300 may be implemented by a control mode transmitter, for example, for non-EDMG PPDU transmission, e.g., as described below.

In some demonstrative embodiments, one or more elements and/or blocks of transmitter architecture 300 may be configured, for example, to generate a non-EDMG PPDU.

In some demonstrative embodiments, as shown in FIG. 3, one or more fields of the non-EDMG PPDU, for example, an L-STF field, an L-CEF field, and/or one or more TRN units of the PPDU, may be generated using, for example, a Golay builder block 302.

For example, transmitter architecture 300 may include Golay builder block 302, which may be configured to build modulated Golay sequences for L-STF 202 and L-CEF 204 (FIG. 2).

In some demonstrative embodiments, as shown in FIG. 3, one or more fields of the non-EDMG PPDU, for example, an L-Header field and/or a data part of the PPDU, may be generated using, for example, a scrambler 304, an LDPC encoder 306, a constellation mapper 308, and/or a spreader 310.

For example, transmitter architecture 300 may include scrambler 304, which may be configured to generate scrambled bits by scrambling bits of L-header 206 and data field 218 (FIG. 2).

For example, transmitter architecture 300 may include LDPC encoder 306, which may be configured to encode the scrambled bits into encoded bits according to the LDPC code.

For example, transmitter architecture 300 may include constellation mapper 308, which may be configured to map the encoded bits into a stream of constellation points according to a constellation scheme.

For example, transmitter architecture 300 may include spreader 310, which may be configured to spread the stream of constellation points according to a Golay sequence.

In some demonstrative embodiments, as shown in FIG. 3, an encoded and modulated bit stream 311 may be mapped to the $N_{TX}$ transmit chains, for example, by applying spatial expansion with relative cyclic shift over the chains.

For example, transmitter architecture 300 may include a transmit chain mapper 312, which may be configured to map bit stream output 311 from Golay builder 302 and spreader 310 to a plurality of transmit chains 363 by applying, for example, a spatial expansion with relative cyclic shift over the plurality of transmit chains.

In some demonstrative embodiments, as shown in FIG. 3, transmitter architecture 300 may include one or more cyclic shifters 314, which may be configured to apply a CSD between the plurality of transmit chains 363.

Figure 4:
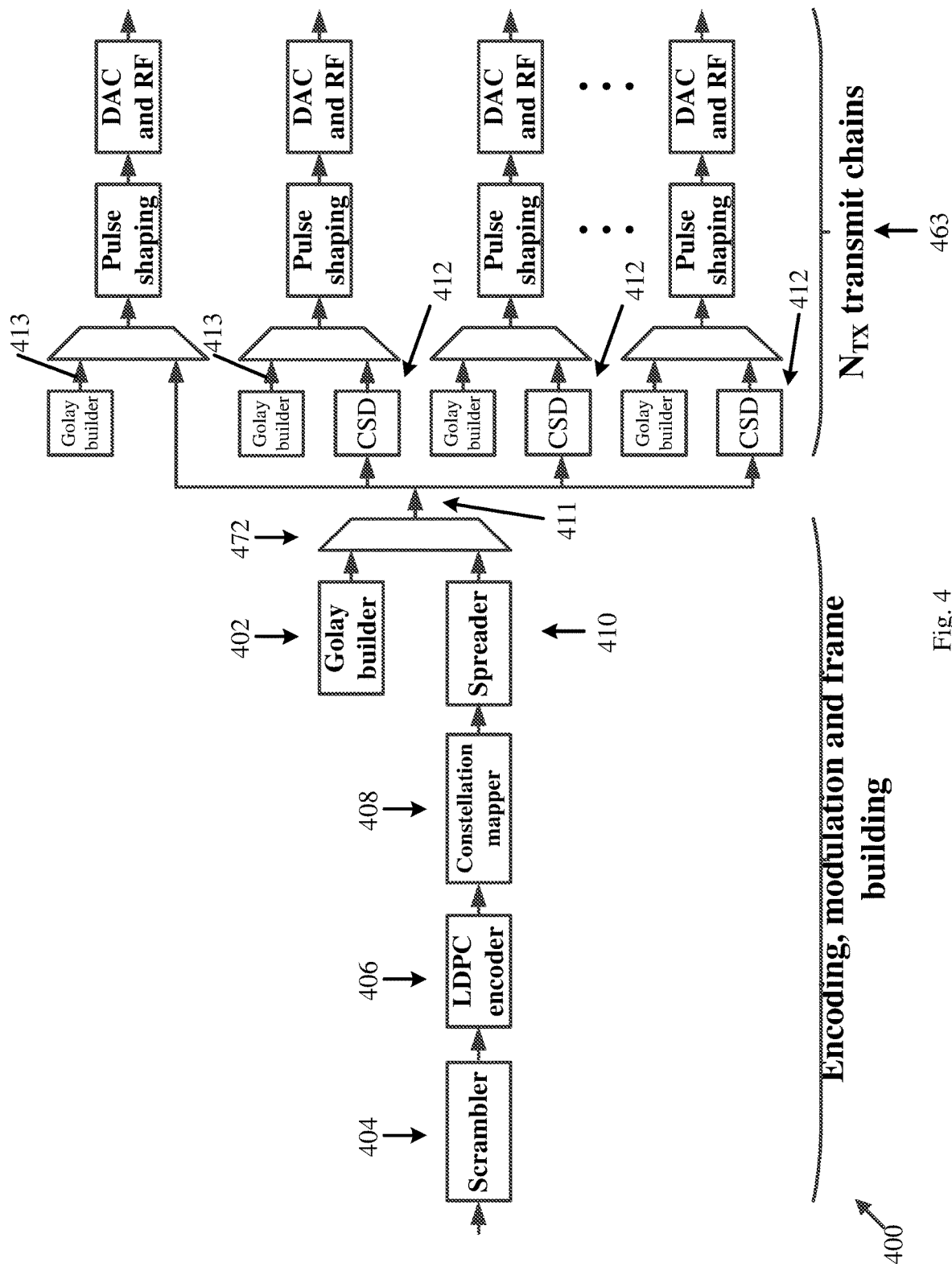
FIG. 4 is a schematic illustration of a transmitter architecture, in accordance with some demonstrative embodiments.

Reference is made to FIG. 4, which schematically illustrates a block diagram of a transmitter architecture 400, in accordance with some demonstrative embodiments.

For example, transmitter 118 (FIG. 1) may be configured to implement one or more elements and/or functionalities of transmitter architecture 400.

For example, transmitter 118 (FIG. 1) may include circuitry and/or logic configured to perform one or more functionalities and/or operations of one or more elements of transmitter architecture 400.

In some demonstrative embodiments, one or more elements and/or blocks of the transmitter architecture of FIG. 4 may be configured, for example, for EDMG PPDU transmission, e.g., as described below.

In some demonstrative embodiments, one or more elements and/or blocks of the transmitter architecture of FIG. 4 may be implemented by a control mode transmitter, for example, for EDMG PPDU transmission, e.g., as described below.

In some demonstrative embodiments, one or more elements and/or blocks of the transmitter architecture of FIG. 4 may be configured, for example, to generate an EDMG PPDU.

In some demonstrative embodiments, as shown in FIG. 4, one or more fields of the EDMG PPDU, for example, an L-STF field, an L-CEF field, and/or one or more TRN units of the PPDU, may be generated using, for example, a Golay builder block 402.

For example, transmitter architecture 400 may include Golay builder block 402, which may be configured to build modulated Golay sequences for L-STF 202 and L-CEF 204 (FIG. 2).

In some demonstrative embodiments, as shown in FIG. 4, one or more fields of the EDMG PPDU, for example, an L-Header field, an EDMG Header A field, and/or a data part of the PPDU, may be generated using, for example, a scrambler 404, an LDPC encoder 406, a constellation mapper 408, and/or a spreader 410.

For example, transmitter architecture 400 may include scrambler 404, which may be configured to generate scrambled bits by scrambling bits of EDMG Header A 208 (FIG. 2).

For example, transmitter architecture 400 may include LDPC encoder 406, which may be configured to encode the scrambled bits into encoded bits according to the LDPC code.

For example, transmitter architecture 400 may include constellation mapper 408, which may be configured to map the encoded bits into a stream of constellation points according to a constellation scheme.

For example, transmitter architecture 400 may include spreader 410, which may be configured to spread the stream of constellation points according to a Golay sequence.

In some demonstrative embodiments, as shown in FIG. 4, the encoded and modulated bit stream 411 may be mapped to the $N_{TX}$ transmit chains, for example, by applying spatial expansion with relative cyclic shift over the chains.

For example, transmitter architecture 400 may include a transmit chain mapper 472, which may be configured to map bit stream output 411 from Golay builder 402 and spreader 410 to a plurality of transmit chains 463 by applying, for example, a spatial expansion with relative cyclic shift over the plurality of transmit chains.

For example, transmitter architecture 400 may include one or more cyclic shifters 412, which may be configured to apply a CSD between a plurality of transmit chains 463.

In some demonstrative embodiments, as shown in FIG. 4, the cyclic shift is not applied, for example, to the TRN units appended to the frame, such that, for example, each chain transmits its own TRN unit, e.g., in accordance with an IEEE 802.11ay Specification and/or any other Specification.

For example, as shown in FIG. 4, a TRN unit 413 may be provided, e.g., by the Golay builder, to a transmit chain, for example, without applying the CSD.

Referring back to FIG. 1, in some demonstrative embodiments, devices 102 and/or 140 may be configured to generate, transmit, receive and/or process one or more transmissions of PPDUs, for example, EDMG PPDUs, for example, for OFDM PHY, e.g., in accordance with an IEEE 802.11ay Specification and/or any other Specification.

In some demonstrative embodiments, devices 102 and/or 140 may be configured to generate, transmit, receive and/or process one or more transmissions of OFDM PPDUs, for example, EDMG OFDM PPDUs, e.g., as described below.

Some demonstrative embodiments are described herein with respect to communicating EDMG OFDM PPDUs. In other embodiments, one or more of the operations and/or communications may be implemented with respect to communication of any other type of PPDUs.

In some demonstrative embodiments, support of the OFDM PHY, e.g., to communicate EDMG OFDM PPDUs, may be optional. For example, in some demonstrative embodiments, devices 102 and/or 140 may be configured to communicate the control mode PPDU, e.g., as described above; and to communicate EDMG OFDM PPDUs, e.g., as described below.

In other embodiments, devices 102 and/or 140 may support communication of the control mode PPDUs, for example, even if EDMG OFDM PPDUs may not be supported.

In some demonstrative embodiments, devices 102 and/or 140 may be configured to generate, transmit, receive and/or process one or more transmissions of the PPDUs, for example, by transmission over a 2.16 GHz bandwidth, a 4.32 GHz bandwidth, a 6.48 GHz bandwidth, a 8.64 GHz bandwidth, and/or any other bandwidth.

In some demonstrative embodiments, the EDMG PPDU format may include one or more EDMG fields, for example, one or more fields of EDMG portion 220 (FIG. 2), which may be intended for, e.g., receivable by and/or decodable by, EDMG STAs, for example, only EDMG STAs.

In some demonstrative embodiments, devices 102 and/or 140 may implement one or more elements and/or functionalities according to a transmitter architecture, which may be configured, for example, to transmit at least EDMG PPDUs, for example, EDMG OFDM PPDUs, e.g., as described below.

In some demonstrative embodiments, the transmitter architecture may be configured, for example, to generate and/or transmit an EDMG Single User (SU) PPDU and/or an EDMG Multi User (MU) PPDU, e.g., as described below.

In some demonstrative embodiments, the transmitter architecture may be configured, for example, to perform transmission PPDUs, for example, over a 2.16 GHz channel, a 4.32 GHz channel, a 6.48 GHz channel, an 8.64 GHz channel, and/or any other channel bandwidth, for example, using $N_{TX}$ transmit chains, e.g., as described below.

In some demonstrative embodiments, the transmitter architecture may be configured, for example, to generate an EDMG PHY PPDU waveform for SU and/or MU transmission, e.g., as described below.

In some demonstrative embodiments, the transmitter architecture may be configured, for example, based on the EDMG PPDU structure, e.g., as described above with respect to FIG. 2.

In some demonstrative embodiments, the transmitter architecture may be configured, for example, to provide a technical solution to allow supporting transmission of an EDMG PPDU, for example, by generating a waveform, which may be configured to support one or more attributes of an EDMG PPDU, for example, in terms of encoding, and/or generation of EDMG fields, e.g., including EDMG-STF/CEF fields.

In some demonstrative embodiments, the transmitter architecture may include, for example, a scrambler, which may be configured to scramble the data, e.g., of a Physical Layer Service Data Unit (PSDU) of the PPDU, for example, to reduce the probability of long sequences of 0s and 1s, e.g., in accordance with an IEEE 802.11 Specification.

In some demonstrative embodiments, the transmitter architecture may include, for example, a stream parser, which may be configured to divide the output of the scrambler into groups of bits, which may be, for example, sent to different encoders, e.g., LDPC encoders, and/or mapping components. For example, the stream parser may divide the output of the scrambler into a plurality of sequences the bits (spatial streams), which may be sent to the different encoders, e.g., in accordance with an encoding scheme of an IEEE 802.11ay Specification.

In some demonstrative embodiments, the transmitter architecture may include, for example, an encoder, e.g., an LDPC encoder or any other encoder, which may be configured to encode the data, e.g., to enable error correction. For example, the encoder may be configured to implement bit padding, for example, to obtain an integer number of codewords and OFDM symbols, e.g., in accordance with an encoding scheme of an IEEE 802.11ay Specification.

In some demonstrative embodiments, the transmitter architecture may include, for example, a constellation mapper, which may be configured to map the sequence of bits in each stream to constellation points (e.g., complex numbers), for example, in accordance with a modulation mapping scheme of an IEEE 802.11ay
Specification.

In some demonstrative embodiments, the transmitter architecture may include, for example, an interleaver, which may be configured to perform interleaving inside an OFDM symbol, for example, in accordance with a block-interleaving scheme of an IEEE 802.11ay Specification, e.g., as described below.

In some demonstrative embodiments, the transmitter architecture may include, for example, a Space-Time Block Code (STBC) encoder, which may be configured to spread constellation points from a first plurality of spatial streams, e.g., $N_{SS}$ spatial streams, into a second plurality of space-time streams, e.g., $N_{STS}$ space-time streams, for example, by using a space-time block code. In one example, an OFDM mode may be configured to define, for example, a single STBC scheme with $N_{SS}=1$ and $N_{STS}=2$, e.g., in accordance with an IEEE 802.11ay Specification. In other embodiments, any other encoding scheme may be used and/or any other number of spatial streams and/or space-time streams may be implemented.

In some demonstrative embodiments, the transmitter architecture may include, for example, a preamble builder, which may be configured to build symbols of one or more fields of the PPDU, e.g., EDMG-STF, EDMG-CEF and/or TRN fields, in a frequency domain, for example, in accordance with an EDMG-STF definition and/or an EDMG-CEF definition, e.g., in accordance with in accordance with an IEEE 802.11ay Specification.

In some demonstrative embodiments, the transmitter architecture may include, for example, a spatial mapper, which may be configured to map space-time streams to transmit chains.

In some demonstrative embodiments, the spatial mapping may be applied per subcarrier basis, e.g., as described below.

In some demonstrative embodiments, the spatial mapping may include, for example, a direct mapping, for example, in which constellation points from each space-time stream are mapped directly into the transmit chains, e.g., according to a one-to-one mapping.

In some demonstrative embodiments, the spatial mapping may include, for example, an indirect mapping, for example, in which constellation points from each space-time stream are mapped to each transmit chain, e.g., the total number of space-time streams is equal to the total number of transmit chains.

In some demonstrative embodiments, the spatial mapping may include, for example, digital beamforming, for example, in which a vector, e.g., each vector, of constellation points from all of the space-time streams is multiplied by a matrix of steering vectors to produce the input to the transmit chains.

In some demonstrative embodiments, the transmitter architecture may be configured, for example, to implement a diversity scheme, for example, a Cyclic Shift Diversity (CSD) scheme, to transmit the same signal over different transmit chains, for example, with a cyclic shift.

In some demonstrative embodiments, the CSD insertion may be configured, for example, to prevent the transmission from unintentional beamforming. In one example, the cyclic shift may be specified per transmitter chain, for example, for a pre-EDMG portion of a PPDU transmission.

In some demonstrative embodiments, the transmitter architecture may be configured, for example, to implement an Inverse Discrete Fourier Transform (IDFT), for example, to apply an Inverse Discrete Fourier Transform to the input block of subcarriers.

In some demonstrative embodiments, the transmitter architecture may include, for example, a Guard Interval (GI) inserter, which may be configured to prepend the OFDM symbol with a guard interval, which may be defined, for example, as a cyclic extension of the OFDM symbol in a time domain, e.g., in accordance with in accordance with an IEEE 802.11ay Specification.

In some demonstrative embodiments, devices 102 and/or 140 may be configured to generate, encode, transmit, receive and/or process and EDMG PPDU, e.g., EDMG PPDU 200 (FIG. 2), as described below.

In some demonstrative embodiments, devices 102 and/or 140 may be configured to generate, encode, transmit, receive and/or process a pre-EDMG portion of an EDMG PPDU transmission, for example, according to a pre-EDMG transmission scheme, e.g., in accordance with an IEEE 802.11ay Specification. In one example, fields of the pre-EDMG portion may be transmitted, for example, according to a non-EDMG duplicate format e.g., in accordance with an IEEE 802.11ay Specification.

In some demonstrative embodiments, for example, the pre-EDMG portion of the EDMG PPDU may include, for example, fields of the non-EDMG portion of the EDMG format preamble and the EDMG-Header-A field of the EDMG portion of the EDMG format preamble. In one example, the pre-EDMG portion may include L-STF 202 (FIG. 2), L-CEF 204 (FIG. 2), L-header 206 (FIG. 2), and/or EDMG Header A 208 (FIG. 2). In other embodiments, the pre-EDMG portion may be configured with any other fields.

In some demonstrative embodiments, devices 102 and/or 140 may be configured to generate, encode, transmit, receive and/or process an EDMG portion of the EDMG PPDU transmission, e.g., as described below.

In some demonstrative embodiments, for example, the EDMG portion may include one or more fields, e.g., subsequent to the pre-EDMG portion. Fore example, the EDMG portion may include one or more of EDMG STF 212 (FIG. 2), EDMG CEF 214 (FIG. 2), EDMG Header B 216 (FIG. 2), data field 218 (FIG. 2), and/or TRN field 224 (FIG. 2).

In some demonstrative embodiments, devices 102 and/or 140 may implement a transmitter, e.g., transmitter 118 and/or transmitter 148, which may include one or more blocks, elements, and/or modules configured to generate the EDMG portion of the EDMG PPDU, e.g., as described below.

In some demonstrative embodiments, devices 102 and/or 140 may implement a transmitter, e.g., transmitter 118 and/or transmitter 148, which may include one or more blocks, elements, and/or modules configured to generate the EDMG portion of a SU EDMG PPDU, e.g., as described below.

In some demonstrative embodiments, devices 102 and/or 140 may implement a transmitter, e.g., transmitter 118 and/or transmitter 148, which may include one or more blocks, elements, and/or modules configured to generate the EDMG portion of a MU EDMG PPDU, e.g., as described below.

In some demonstrative embodiments, transmitters 118 and/or 148 may implement the transmitter architecture, which may be configured to transmit at least EDMG PPDUs, e.g., as described below.

In some demonstrative embodiments, transmitter 118 may be configured to transmit an EDMG OFDM PPDU via a plurality of transmit chains in a channel bandwidth over a frequency band above 45 GHz, e.g., as described below.

In other embodiments, transmitter 118 may transmit the EDMG OFDM PPDU over any other frequency band.

In some demonstrative embodiments, transmitter 118 may be configured to transmit the EDMG OFDM PPDU over a channel bandwidth of 2.16 GHz, 4.32 GHz, 6.48 GHz, or 8.64 GHz, e.g., as described below.

In other embodiments, transmitter 118 may transmit the EDMG OFDM PPDU over any other channel bandwidth.

In some demonstrative embodiments, transmitter 118 may include, for example, a constellation mapper, which may be configured to map a plurality of scrambled and encoded spatial bit streams into a respective plurality of spatial streams of constellation points, e.g., as described below.

In some demonstrative embodiments, the plurality of scrambled and encoded spatial bit streams may be based at least on a data field of the EDMG OFDM PPDU, e.g., as described below.

In some demonstrative embodiments, transmitter 118 may include, for example, a symbol interleaver, which may be configured to interleave constellation points in the plurality of spatial streams of constellation points, e.g., as described below.

In some demonstrative embodiments, the interleaver may be configured to interleave a plurality of symbols in an OFDM symbol data block for a spatial stream based, for example, at least on a count of 2.16 GHz channels in a channel bandwidth for transmission of the EDMG OFDM PPDU and a number of the plurality of spatial streams, e.g., as described below.

In some demonstrative embodiments, the interleaver may be configured to implement an OFDM interleaver scheme for vertical MIMO coding, e.g., as described below.

In some demonstrative embodiments, the interleaver may be implemented with respect to one or more modulation schemes, for example, while interleaving may not be required for one or more other modulation schemes, e.g., as described below.

In some demonstrative embodiments, the interleaver may be implemented for interleaving EDMG OFDM PPDUs modulated according to a 16 Quadrature Amplitude Modulation (QAM) scheme and/or a 64-QAM modulation scheme, for example, to enhance the operation in frequency selective channels, e.g., as described below.

In other embodiments, the interleaver may be implemented for any other additional or alternative type of modulation.

In some demonstrative embodiments, the OFDM symbol data block may include a plurality of data symbols in an OFDM symbol of the spatial stream and the plurality of padded zeros, e.g., as described below.

In some demonstrative embodiments, the interleaver may be configured to generate a permuted OFDM data block, for example, by permuting the OFDM data block according to an array of permutation indexes, e.g., as described below.

In some demonstrative embodiments, the padded zeros at the first step, e.g., after permutation, may be discarded (punctured) to form the output array of length $N_{SD}$.

In some demonstrative embodiments, the array of permutation indexes may be based on a first permutation parameter and a second permutation parameter, e.g., as described below.

In some demonstrative embodiments, the first permutation parameter may be based, for example, at least on the count of 2.16 GHz channels in the channel bandwidth, e.g., as described below.

In some demonstrative embodiments, the second permutation parameter may be based, for example, on a count of data subcarriers per OFDM symbol, a count of a plurality of padded zeros and the first permutation parameter, e.g., as described below.

In some demonstrative embodiments, the interleaver may be configured to perform symbol interleaving inside the OFDM symbol data block. For example, the interleaver may have a table structure of size Nx by Ny. The writing may be performed in row by row basis. The reading may be performed in column by column basis.

In some demonstrative embodiments, for example, the parameter Nx may be changed adaptively, for example, based on the effective codeword length assigned to the given spatial stream. The parameter Ny may be computed, for example, as $(N_{SD}+N_P)/Nx$, where $N_{SD}$ defines the number of data subcarriers per OFDM symbol and $N_P$ is the number of padded zero bits, e.g., as described below. The zero bits may be padded to obtain integer Nx and Ny values. The zero pad bits may be discarded after the output of interleaver. The interleaver $N_{SD}$ symbols may be mapped to the OFDM data subcarriers, e.g., as described below.

In other embodiments, the parameters Nx and/or Ny may be defined according to any other scheme and/or criteria.

In some demonstrative embodiments, the parameter $N_P$ may be defined according to a channel bonding factor, denoted $N_{CB}$, representing a count of 2.16 GHz channels in the channel bandwidth.

For example, $N_P$ may be equal to 0, when $N_{CB}$ is equal to 1; $N_P$ may be equal to 34, when $N_{CB}$ is equal to 2; $N_P$ may be equal to 18, when $N_{CB}$ is equal to 3; and/or $N_P$ may be equal to 4, when $N_{CB}$ is equal to 4. In other embodiments, any other definition of the parameter $N_P$, e.g., based on the parameter $N_{CB}$, may be used.

In other embodiments, the parameter $N_P$ may be defined in any other way.

For example, the parameter $N_P$ may be defined based on $N_{SD}$, for example, as specified below in Table 1.

TABLE 1

$N_P$ parameter definition

| $N_{SD}$ | 16-QAM | 64-QAM |
|---|---|---|
| 336 | $N_P = 0$ | $N_P = 0$ |
| 734 | $N_P = 2$ | $N_P = 10$ |
| 1134 | $N_P = 2$ | $N_P = 18$ |
| 1532 | $N_P = 4$ | $N_P = 4$ |

In some demonstrative embodiments, the interleaver may be configured to perform an interleaving inside the OFDM data block, denoted $d_{in}^{(iss,q)}$, of length $N_{SD}+N_P$, e.g., as described below.

In some demonstrative embodiments, the interleaver may be configured to permute the OFDM data block, denoted $d_{in}^{(iss,q)}$, corresponding to an OFDM symbol number q in an $i_{SS}$-th spatial stream, into a permuted OFDM symbol, denoted $d_{out}^{(iss,q)}$, e.g., as follows:

$$d_{out}^{(iss,q)} = (d_{idx(0)}^{(iss,q)}, d_{idx(1)}^{(iss,q)}, \ldots, d_{idx((N_{SD}+N_P)-1)}^{(iss,q)})$$

wherein:

$$d_{in}^{(iss,q)} = (d_0^{(iss,q)}, d_1^{(iss,q)}, \ldots, d_{N_{SD}-1}^{(iss,q)}, 0_0, 0_1, \ldots, 0_{N_P-1}) \quad (1)$$

wherein $N_{SD}$ denotes the count of data subcarriers per OFDM symbol, $N_P$ denotes the count of the plurality of padded zeros, and idx( ) denotes a permutation index in the array of permutation indexes.

In some demonstrative embodiments, the array of permutation indexes, denoted idx, may be defined, e.g., as follows:

$$idx(j \times N_x + i) = N_y \times i + j, \text{ where} \quad (2)$$

$$i = 0, 1, \ldots, N_x - 1 \text{ and } j = 0, 1, \ldots, N_y - 1$$

$$x = \left( (N_{SD} + N_P) \times \sum_{i_{SS}=1}^{N_{SS_{iuser}}} N_{BPSC_{iuser}, i_{SS}} \right) / L_{CW_{iuser}}$$

wherein:

$x < 2.5 \times N_{CB}: N_x = 2 \times N_{CB}$ $2.5 \times N_{CB} \leq x < 3.5 \times N_{CB}: N_x = 3 \times N_{CB}$ $3.5 \times N_{CB} \leq x < 5 \times N_{CB}: N_x = 4 \times N_{CB}$ $5 \times N_{CB} \leq x < 7 \times N_{CB}: N_x = 6 \times N_{CB}$ $7 \times N_{CB} \leq x < 10 \times N_{CB}: N_x = 8 \times N_{CB}$ $10 \times N_{CB} \leq x < 14 \times N_{CB}: N_x = 12 \times N_{CB}$ $14 \times N_{CB} \leq x < 20 \times N_{CB}: N_x = 16 \times N_{CB}$ $x \geq 20 \times N_{CB}: N_x = 24 \times N_{CB}$ wherein:

$N_y = (N_{SD} + N_P)/N_x$ wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS_{iuser}}$ denotes a count of spatial streams for an $i_{user}$-th user, $N_{BPSC_{iuser}, i_{SS}}$ denotes a count of coded bits per constellation point for the $i_{user}$-th user and an $i_{SS}$-th spatial stream, and $L_{CW_{iuser}}$ and denotes an LDPC codeword length for the $i_{user}$-th user.

In other embodiments, the array of permutation indexes may be defined according to one or more other schemes, e.g., as described below.

In some demonstrative embodiments, the array of permutation indexes idx may be defined, for example, for 16-QAM modulation, for example, according to Equation 2, while using, for example, the following definition for Nx:

$x \leq 3 \times N_{CB}: N_x = 2 \times N_{CB}$ $3 \times N_{CB} < x \leq 6 \times N_{CB}: N_x = 4 \times N_{CB}$ $6 \times N_{CB} < x \leq 12 \times N_{CB}: N_x = 8 \times N_{CB}$ $x > 12 \times N_{CB}: N_x = 16 \times N_{CB}$ In some demonstrative embodiments, the array of permutation indexes idx may be defined, for example, for 64-QAM modulation, for example, according to Equation 2, while using, for example, the following definition for Nx:

$x \leq 4 \times N_{CB}: N_x = 3 \times N_{CB}$ $4 \times N_{CB} < x \leq 8 \times N_{CB}: N_x = 6 \times N_{CB}$ $8 \times N_{CB} < x \leq 16 \times N_{CB}: N_x = 12 \times N_{CB}$ $x > 16 \times N_{CB}: N_x = 24 \times N_{CB}$ In some demonstrative embodiments, an OFDM interleaver for vertical MIMO coding system may define a symbol interleaver for 16-QAM and 64-QAM modulation. The interleaver may perform modulated complex symbols interleaving inside the OFDM symbol and the parameters of the interleaver may depend on the $N_{SD}N_{CB}$, $N_{SS_{iuser}}$, $L_{CW_{iuser}}$, and $N_{BPSC_{iuser}, i_{SS}}$ parameters.

In some demonstrative embodiments, the input to the interleaver scheme for $i_{SS}$-th spatial stream may be an OFDM data block $d_{in}^{(iss,q)}$ of length $N_{SD}$ composed of 16-QAM or 64-QAM symbols:

$$d_{in}^{(iss,q)} = (d_0^{(iss,q)}, d_1^{(iss,q)}, \ldots, d_{N_{SD}-1}^{(iss,q)}, 0_0, 0_1, \ldots, 0_{N_P-1}),$$

where q denotes OFDM symbol number, q=0, 1, . . . , $N_{SYM}-1$.

In some demonstrative embodiments, the interleaving may be performed inside the block of length $N_{SD} N_P$, where $N_P$ parameter may be specified, e.g., as described above, and may define the number of zeros padded to the data block. The output of the interleaver scheme for $i_{SS}$-th spatial stream may be a permuted OFDM data block of the same length defined, e.g., according to Equation 1.

In some demonstrative embodiments, the array of permutation indexes idx may be constructed, e.g., according to Equation 2.

It is understood that the above descriptions are for purposes of illustration and are not meant to be limiting.

In some demonstrative embodiments, transmitter 118 may include, for example, a preamble builder, which may be configured to build symbols of an EDMG-STF and an EDMG-CEF in a frequency domain, e.g., as described below.

In some demonstrative embodiments, transmitter 118 may include, for example, a spatial mapper, which may be configured to map the spatial streams of constellation points and the symbols of the EDMG-STF and EDMG-CEF fields to a plurality of transmit chains for transmission of the EDMG OFDM PPDU, e.g., as described below.

In some demonstrative embodiments, transmitter 118 may include, for example, a scrambler, which may be configured to generate scrambled bits, for example, by scrambling data bits of the data field of the EDMG OFDM PPDU, e.g., as described below.

In some demonstrative embodiments, transmitter 118 may include, for example, an encoder, which may be configured to encode the scrambled bits into encoded bits according to an LDPC code, e.g., as described below.

In some demonstrative embodiments, transmitter 118 may include, for example, a Space Time Block Code (STBC) encoder, which may be configured to spread constellation points from the plurality of spatial streams into a plurality of space-time streams, e.g., as described below.

In some demonstrative embodiments, transmitter 118 may include, for example, a TRN builder, which may be configured to build one or more TRN units of the EDMG OFDM PPDU, e.g., as described below.

In some demonstrative embodiments, transmitter 118 may be configured to transmit an EDMG OFDM SU PPDU, e.g., as described below.

In some demonstrative embodiments, transmitter 118 may be configured to transmit an EDMG OFDM MU PPDU, e.g., as described below.

In some demonstrative embodiments, transmitter 118 may be configured to process a plurality of EDMG PPDU portions of the EDMG MU PPDU to be transmitted to a respective plurality of users, e.g., as described below.

In some demonstrative embodiments, the constellation mapper may be configured to map a plurality of scrambled and encoded spatial bit streams for a user into a respective plurality of spatial streams of constellation points for the user, for example, when the PPDU includes the MU PPDU, e.g., as described below.

In some demonstrative embodiments, the symbol interleaver may interleave constellation points in the plurality of spatial streams of constellation points for the user, e.g., as described above.

In some demonstrative embodiments, the spatial mapper may be configured to map to the plurality of transmit chains a plurality of user spatial streams, the plurality of user spatial streams including one or more spatial streams for each user of the plurality of users, e.g., as described below.

In some demonstrative embodiments, the plurality of scrambled and encoded spatial bit streams for the user may be based on bits of an EDMG Header (EDMG Header B) for the user, e.g., EDMG-Header-B 216 (FIG. 2), and a data field for the user, e.g., data field 218 (FIG. 2), e.g., as described below.

Figure 5:
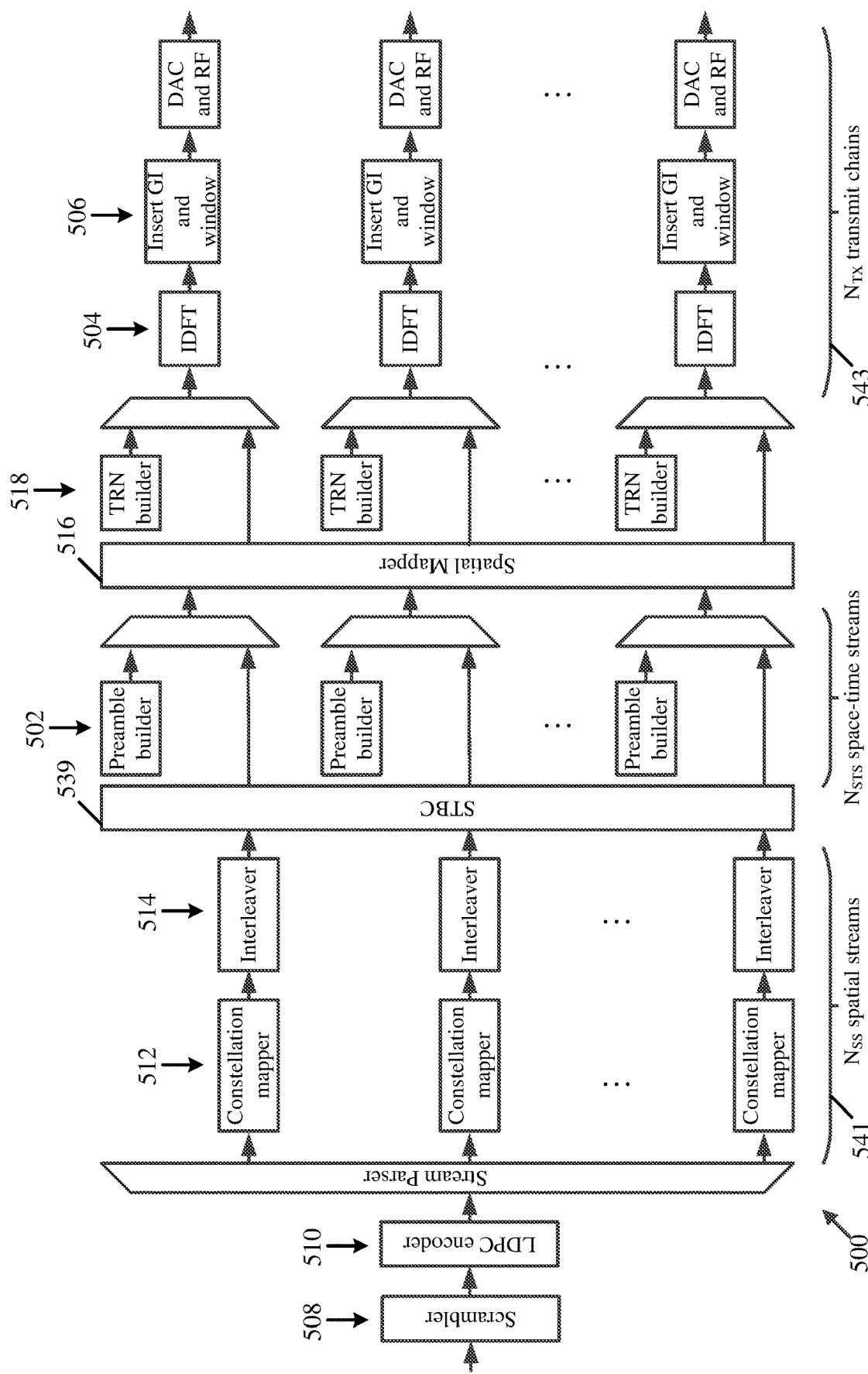
FIG. 5 is a schematic illustration of a transmitter architecture, in accordance with some demonstrative embodiments.

Reference is made to FIG. 5, which schematically illustrates a transmitter architecture 500, in accordance with some demonstrative embodiments.

For example, transmitter 118 (FIG. 1) may be configured to implement one or more elements and/or functionalities of transmitter architecture 500.

For example, transmitter 118 (FIG. 1) may include circuitry and/or logic configured to perform one or more functionalities and/or operations of one or more elements of transmitter architecture 500.

In some demonstrative embodiments, transmitter architecture 500 may be configured, for example, to generate and/or transmit an EDMG portion of a SU PPDU transmission, e.g., as described below.

In some demonstrative embodiments, one or more elements of FIG. 5 may be implemented by transmitter blocks to generate the EDMG portion of a SU PPDU.

In some demonstrative embodiments, for example, the EDMG-STF and EDMG-CEF fields and TRN units may be generated using, for example, a preamble builder block 502, an IDFT block 504, and a GI insertion block 506.

For example, transmitter architecture 500 may include preamble builder 502, which may be configured to build symbols of EDMG-STF 212 (FIG. 2) and EDMG-CEF 214 (FIG. 2), e.g., in a frequency domain.

In some demonstrative embodiments, for example, the data part of the PPDU may be generated using, for example, a scrambler block 508, an LDPC encoder block 510, a constellation mapper block 512, an interleaver block 514, an IDFT block 504, and a GI insertion block 506.

For example, transmitter architecture 500 may include scrambler 508, which may be configured to generate scrambled bits by scrambling data bits of the data field of the EDMG OFDM PPDU, e.g., as described above.

For example, transmitter architecture 500 may include LDPC encoder 510, which may be configured to encode the scrambled bits into encoded bits according to the LDPC code, e.g., as described above.

For example, transmitter architecture 500 may include constellation mapper 512, which may be configured to map a plurality of scrambled and encoded spatial bit streams into a respective plurality of spatial streams of constellation points, e.g., as described above.

For example, transmitter architecture 500 may include interleaver 514, which may be configured to interleave constellation points in the plurality of spatial streams of constellation points, e.g., as described above.

In some demonstrative embodiments, interleaver 514 may interleave a plurality of symbols in an OFDM symbol data block for a spatial stream based at least on a count of 2.16 GHz channels in a channel bandwidth for transmission of the EDMG OFDM PPDU and a number of the plurality of spatial streams, e.g., as described above.

In some demonstrative embodiments, interleaver 514 may be applied to one or more types of modulations, for example, to 16-QAM and 64-QAM modulations only. For example, the interleaver may not be implemented for some types of modulations.

In some demonstrative embodiments, as shown in FIG. 5, for example, if an STBC encoder 539 is applied, then a single spatial stream may be mapped to two space-time streams, e.g., in accordance with an IEEE 802.11ay Specification.

For example, the $N_{STS}$ space-time streams 541 may be further mapped to $N_{TX}$ transmit chains 543, where $N_{STS} \leq N_{TX}$.

In some demonstrative embodiments, transmitter architecture 500 may include a spatial mapper 516, which may be configured to map the spatial streams of constellation points and the symbols of the EDMG-STF 212 (FIG. 2) and EDMG-CEF 214 (FIG. 2) fields to a plurality of transmit chains 543, for example, for transmission of the EDMG OFDM PPDU, e.g., as described above.

In some demonstrative embodiments, transmitter architecture 500 may include a TRN builder 518, which may be configured to build one or more TRN units of the EDMG OFDM PPDU, e.g., as described above.

Figure 6:
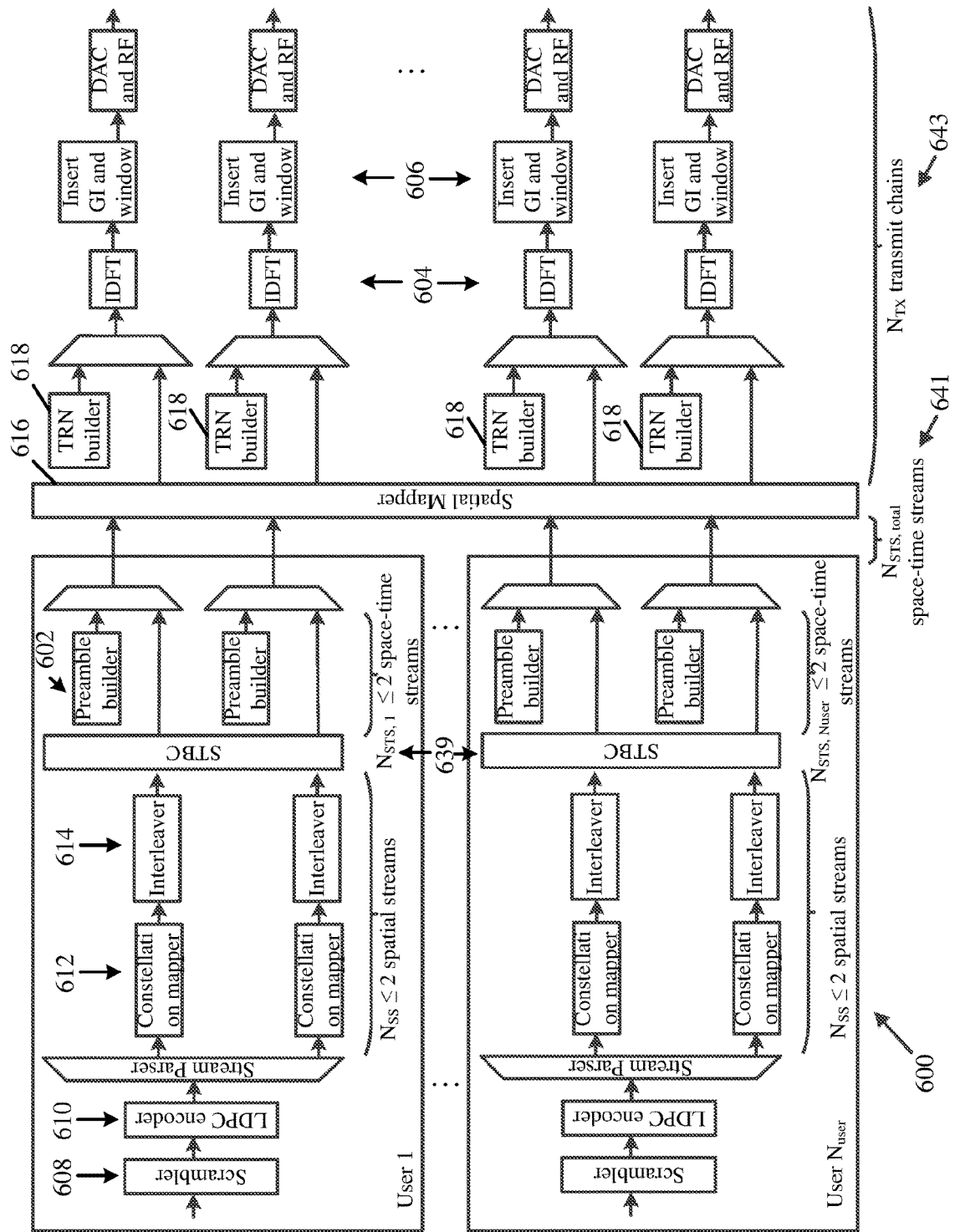
FIG. 6 is a schematic illustration of a transmitter architecture, in accordance with some demonstrative embodiments.

Reference is made to FIG. 6, which schematically illustrates a transmitter architecture 600, in accordance with some demonstrative embodiments.

For example, transmitter 118 (FIG. 1) may be configured to implement one or more elements and/or functionalities of transmitter architecture 600.

For example, transmitter 118 (FIG. 1) may include circuitry and/or logic configured to perform one or more functionalities and/or operations of one or more elements of transmitter architecture 600.

In some demonstrative embodiments, transmitter architecture 600 may be configured, for example, to generate and/or transmit an EDMG portion of a MU PPDU transmission, e.g., as described below.

In some demonstrative embodiments, one or more elements of FIG. 6 may be implemented by transmitter blocks to generate the EDMG portion of a MU PPDU.

In some demonstrative embodiments, for example, the EDMG-STF and EDMG-CEF fields and TRN units may be generated using, for example, a preamble builder block 602, an IDFT block 604, and a GI insertion block 606.

For example, transmitter architecture 600 may include preamble builder 602, which may be configured to build symbols of EDMG-STF 212 (FIG. 2) and EDMG-CEF 214 (FIG. 2), e.g., in a frequency domain.

In some demonstrative embodiments, for example, the EDMG-Header-B and data part of the PPDU may be generated using, for example, a scrambler block 608, an LDPC encoder block 610, a constellation mapper block 612, an interleaver block 614, IDFT block 604, and GI insertion block 606.

For example, transmitter architecture 600 may include scrambler 608, which may be configured to generate scrambled bits by scrambling data bits of the data field of the EDMG OFDM PPDU, e.g., as described above.

For example, transmitter architecture 600 may include LDPC encoder 610, which may be configured to encode the scrambled bits into encoded bits according to the LDPC code, e.g., as described above.

For example, transmitter architecture 600 may include constellation mapper 612, which may be configured to map a plurality of scrambled and encoded spatial bit streams for a user into a respective plurality of spatial streams of constellation points for the user, e.g., as described above.

For example, transmitter architecture 600 may include interleaver 614, which may be configured to interleave constellation points in the plurality of spatial streams of constellation points for the user, e.g., as described above.

In some demonstrative embodiments, interleaver 614 may interleave a plurality of symbols in an OFDM symbol data block for a spatial stream based at least on a count of 2.16 GHz channels in a channel bandwidth for transmission of the EDMG OFDM PPDU and a number of the plurality of spatial streams, e.g., as described above.

In some demonstrative embodiments, interleaver 614 may be applied to one or more types of modulations, for example, to 16-QAM and 64-QAM modulations only, e.g., as described above.

In some demonstrative embodiments, the PPDU encoding may use the seed value defined in the EDMG-Header-B and has independent flow per user. However, transmitter 118 (FIG. 1) may keep the common space-time streams numeration over all users.

In some demonstrative embodiments, for example, if an STBC encoder 639 is applied, then a single spatial stream may be mapped to two space-time streams, e.g., in accordance with an IEEE 802.11ay Specification.

For example, the $N_{STS}$ space-time streams 641 are further mapped to $N_{TX}$ transmit chains 643, where $N_{STS} \leq N_{TX}$.

In some demonstrative embodiments, transmitter architecture 600 may include a spatial mapper 616, which may be configured to map to a plurality of transmit chains 643 a plurality of user spatial streams 641, the plurality of user spatial streams including, for example, one or more spatial streams for each user of the plurality of users, e.g., as described above.

In some demonstrative embodiments, transmitter architecture 600 may include a TRN builder 618, which may be configured to build one or more TRN units of the EDMG OFDM PPDU, e.g., as described above.

In some demonstrative embodiments, LDPC encoding may be implemented before stream parsing, e.g., as discussed above with reference to FIGS. 5 and 6.

In other embodiments, the LDPC encoding may be implemented after the stream parsing, e.g., as discussed below with reference to FIGS. 7 and 8.

Figure 7:
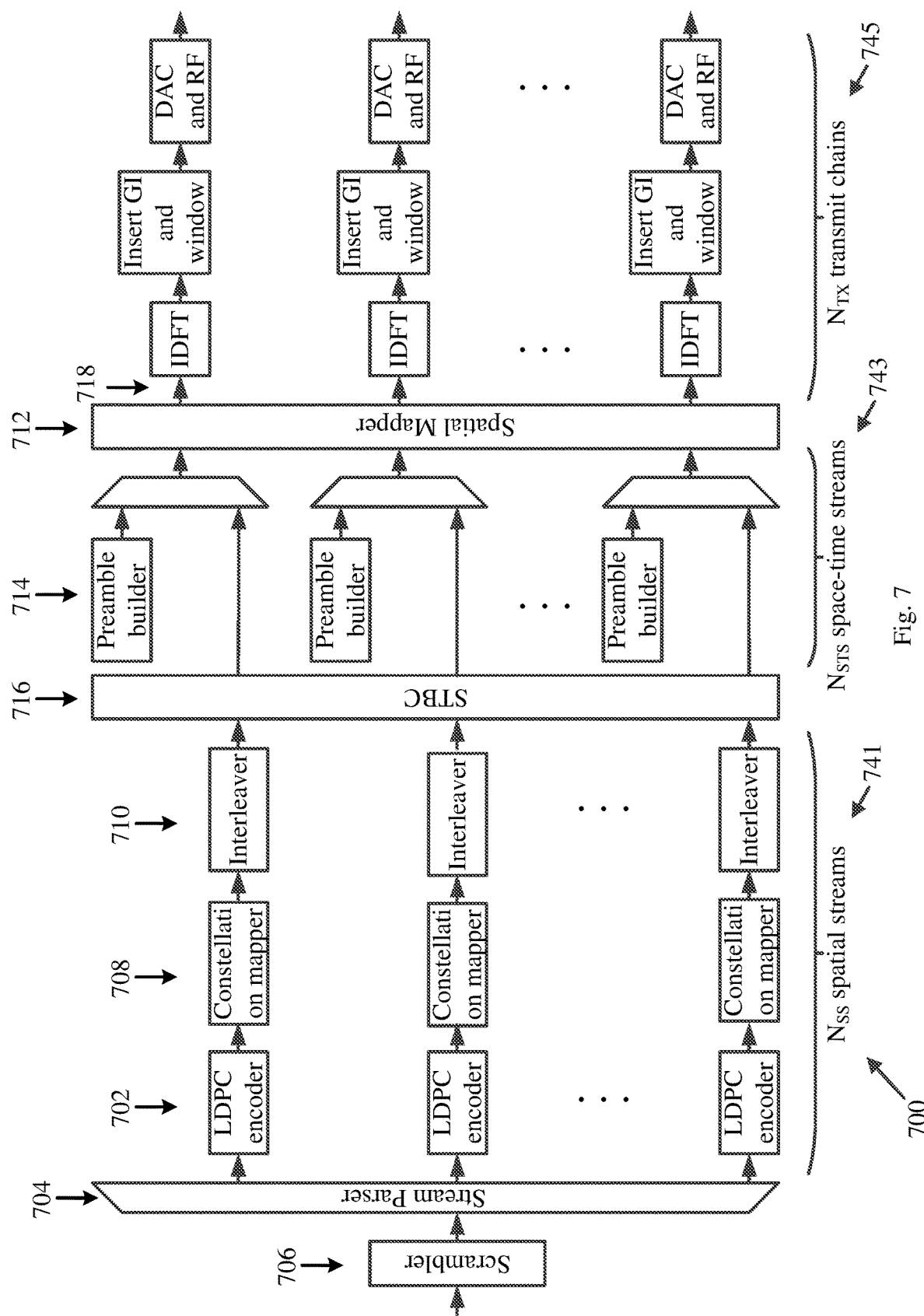
FIG. 7 is a schematic illustration of a transmitter architecture, in accordance with some demonstrative embodiments.

Reference is made to FIG. 7, which schematically illustrates a transmitter architecture 700 configured, for example, to generate and/or transmit an EDMG portion of a SU PPDU transmission, in accordance with some demonstrative embodiments.

For example, transmitter 118 (FIG. 1) may be configured to implement one or more elements and/or functionalities of transmitter architecture 700.

In some demonstrative embodiments, as shown in FIG. 7, transmitter architecture 700 may include a scrambler 706, which may be configured to generate scrambled bits by scrambling data bits of the data field of the EDMG OFDM PPDU, e.g., as described above.

In some demonstrative embodiments, as shown in FIG. 7, transmitter architecture 700 may include an LDPC encoder 702, which may be configured to encode the scrambled bits into encoded bits according to an LDPC code, e.g., as described above.

In some demonstrative embodiments, as shown in FIG. 7, transmitter architecture 700 may include a constellation mapper 708, which may be configured to map a plurality of scrambled and encoded spatial bit streams into a respective plurality of spatial streams of constellation points, e.g., as described above.

In some demonstrative embodiments, as shown in FIG. 7, transmitter architecture 700 may include an interleaver 710, which may be configured to interleave constellation points in the plurality of spatial streams of constellation points, e.g., as described above.

In some demonstrative embodiments, interleaver 710 may be configured to interleave a plurality of symbols in an OFDM symbol data block for a spatial stream based at least on a count of 2.16 GHz channels in a channel bandwidth for transmission of the EDMG OFDM PPDU and a number of the plurality of spatial streams, e.g., as described above.

In some demonstrative embodiments, as shown in FIG. 7, transmitter architecture 700 may include an STBC encoder 716, which may be configured to spread constellation points from a plurality of spatial streams 741 into a plurality of space-time streams 743, e.g., as described above.

In some demonstrative embodiments, as shown in FIG. 7, transmitter architecture 700 may include a preamble builder 714, which may be configured to build symbols of EDMG-STF 212 (FIG. 2) and EDMG-CEF 214 (FIG. 2), e.g., in a frequency domain.

In some demonstrative embodiments, as shown in FIG. 7, transmitter architecture 700 may include a spatial mapper 712, which may be configured to map spatial streams 743 of constellation points and the symbols of the EDMG-STF 212 (FIG. 2) and EDMG-CEF 214 (FIG. 2) fields to a plurality of transmit chains 745, for example, for transmission of the EDMG OFDM PPDU, e.g., as described above.

In some demonstrative embodiments, as shown in FIG. 7, transmitter architecture 700 may include a TRN builder 718, which may be configured to build one or more TRN units of the EDMG OFDM PPDU, e.g., as described above.

In some demonstrative embodiments, as shown in FIG. 7, LDPC encoder 702 may be implemented after a stream parser 704.

For example, as shown in FIG. 7, transmitter architecture 700 may include scrambler 706 to generate scrambled bits by scrambling bits of a data field in an EDMG portion of a PPDU; stream parser 704 to parse the scrambled bits into a plurality of scrambled bit streams in a respective plurality of spatial streams; one or more, e.g., a plurality of, encoders 702 to encode the plurality of scrambled bit streams into a respective plurality of encoded bit streams, e.g., according to a LDPC code; one or more, e.g., a plurality of, constellation mappers 708 to map the plurality of encoded bit streams into a respective plurality of streams of constellation points according to a constellation scheme; an STBC encoder 716 to spread constellation points from the plurality of spatial streams into a plurality of space-time streams; a preamble builder 714 to build symbols of one or more fields in the EDMG portion over the plurality of space-time streams; and/or a spatial mapper 712 to map outputs of the preamble builder and the STBC encoder from the plurality of space-time streams to a plurality of transmit chains, e.g., as described above.

In some demonstrative embodiments, for example, as shown in FIG. 7, transmitter architecture 700 may include one or more, e.g., a plurality of, interleavers 710 to interleave constellation points in the plurality of streams of constellation points, respectively, e.g., as described above.

In some demonstrative embodiments, for example, as shown in FIG. 7, the plurality of transmit chains 745 may include a respective plurality of Inverse Discrete Fourier Transforms (IDFT), e.g., as described above.

In some demonstrative embodiments, for example, as shown in FIG. 7, the plurality of transmit chains 745 may include a respective plurality of GI inserters, e.g., as described above.

In some demonstrative embodiments, the transmitter architecture 700 may include some or all of the elements shown in FIG. 7 and/or one or more elements may be optional and/or implemented in some configurations. For example, the STBC encoder may optionally be included, for example, when STBC is to be supported, e.g., as described above. For example, the interleaver may be included, for example, for one or more modulation schemes, e.g., as described above.

Figure 8:
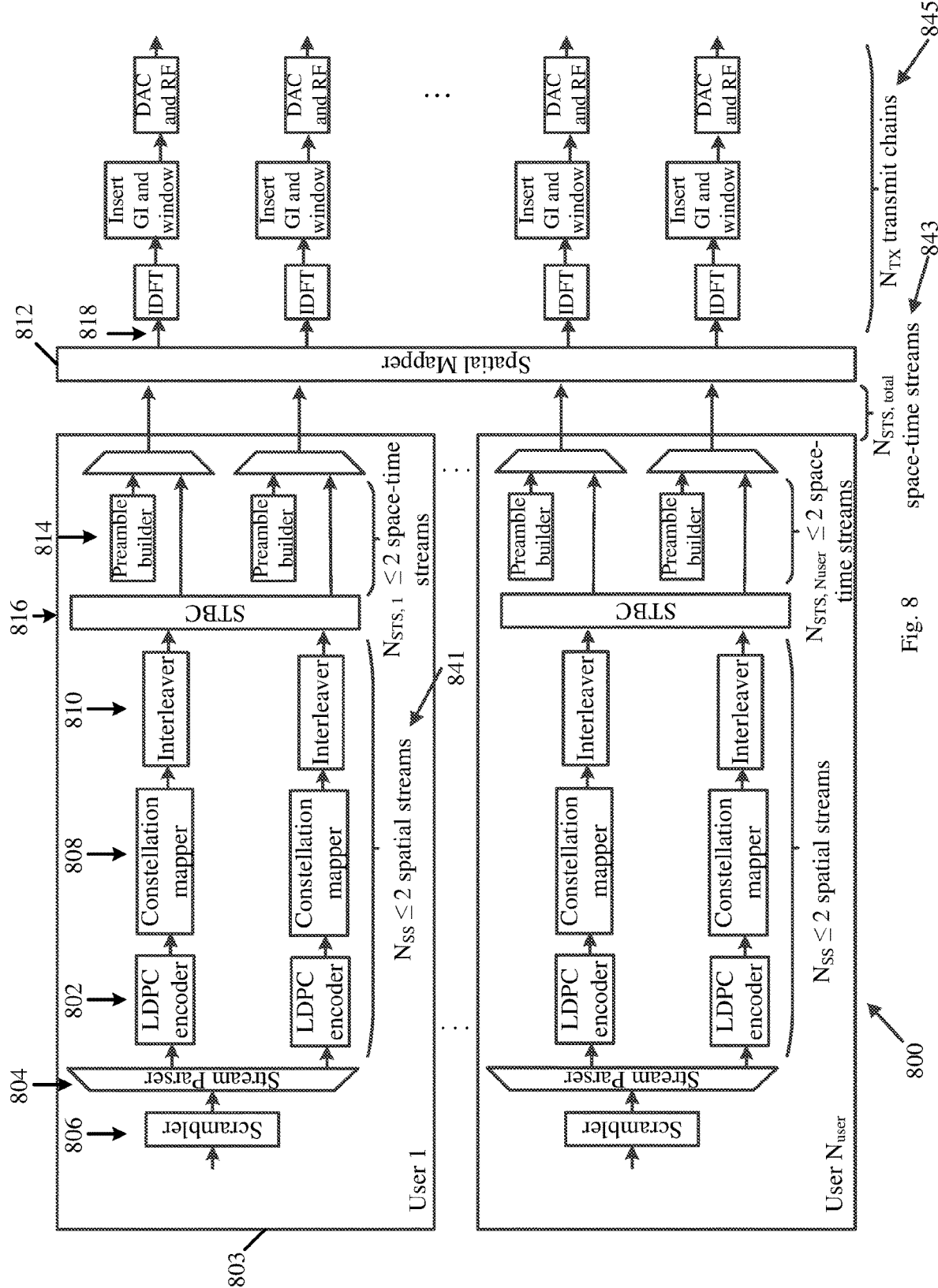
FIG. 8 is a schematic illustration of a transmitter architecture, in accordance with some demonstrative embodiments.

Reference is made to FIG. 8, which schematically illustrates a transmitter architecture 800 configured, for example, to generate and/or transmit an EDMG portion of a MU PPDU transmission, in accordance with some demonstrative embodiments.

For example, transmitter 118 (FIG. 1) may be configured to implement one or more elements and/or functionalities of transmitter architecture 800.

In some demonstrative embodiments, as shown in FIG. 8, transmitter architecture 800 may include a scrambler 806, which may be configured to generate scrambled bits by scrambling data bits of the data field of the EDMG OFDM PPDU, e.g., as described above.

In some demonstrative embodiments, as shown in FIG. 8, transmitter architecture 800 may include an LDPC encoder 802, which may be configured to encode the scrambled bits into encoded bits according to an LDPC code, e.g., as described above.

In some demonstrative embodiments, as shown in FIG. 8, transmitter architecture 800 may include a constellation mapper 808, which may be configured to map a plurality of scrambled and encoded spatial bit streams for a user into a respective plurality of spatial streams of constellation points for the user, e.g., as described above.

In some demonstrative embodiments, as shown in FIG. 8, transmitter architecture 800 may include an interleaver 810, which may be configured to interleave constellation points in the plurality of spatial streams of constellation points for the user, e.g., as described above.

In some demonstrative embodiments, interleaver 810 may be configured to interleave a plurality of symbols in an OFDM symbol data block for a spatial stream based at least on a count of 2.16 GHz channels in a channel bandwidth for transmission of the EDMG OFDM PPDU and a number of the plurality of spatial streams, e.g., as described above.

In some demonstrative embodiments, as shown in FIG. 8, transmitter architecture 800 may include an STBC encoder 816, which may be configured to spread constellation points from a plurality of spatial streams 841 into a plurality of space-time streams 843, e.g., as described above.

In some demonstrative embodiments, as shown in FIG. 8, transmitter architecture 800 may include a preamble builder 814, which may be configured to build symbols of EDMG-STF 212 (FIG. 2) and EDMG-CEF 214 (FIG. 2), e.g., in a frequency domain.

In some demonstrative embodiments, as shown in FIG. 8, transmitter architecture 800 may include a spatial mapper 812, which may be configured to map to a plurality of transmit chains 845 a plurality of user spatial streams 843, e.g., as described above.

In some demonstrative embodiments, plurality of user spatial streams 843 may include one or more spatial streams for each user of the plurality of users, e.g., as described above.

In some demonstrative embodiments, as shown in FIG. 8, transmitter architecture 800 may include a TRN builder 818, which may be configured to build one or more TRN units of the EDMG OFDM PPDU, e.g., as described above.

In some demonstrative embodiments, as shown in FIG. 8, LDPC encoder 802 may be implemented after a stream parser 804.

For example, as shown in FIG. 8, transmitter architecture 800 may include a plurality of processing modules 803 to process a respective plurality of EDMG PPDU portions to be transmitted to a respective plurality of users.

For example, as shown in FIG. 8, a processing module 803, e.g., each processing module 803, to process an EDMG PPDU portion of the plurality of EDMG PPDU portions may include a scrambler 806 to generate scrambled bits by scrambling bits of a header B field and a data field in the EDMG portion; a stream parser 804 to parse the scrambled bits into a scrambled bit streams in a respective plurality of spatial streams; one or more, e.g., a plurality of, encoders 802 to encode the plurality of scrambled bit streams into a respective plurality of encoded bit streams, e.g., according to an LDPC code; one or more, e.g., a plurality of, constellation mappers 808 to map the plurality of encoded bit streams into a respective plurality of streams of constellation points according to a constellation scheme; an STBC encoder 816 to spread constellation points from the plurality of spatial streams into a plurality of space-time streams; and/or a preamble builder 814 to build symbols of one or more fields in the EDMG PPDU portion over the plurality of space-time streams, e.g., as described above.

In some demonstrative embodiments, as shown in FIG. 8, the transmitter architecture 800 may include a spatial mapper 812 to map outputs of the plurality processing modules 803 to the plurality of transmit chains 845, e.g., as described above.

In some demonstrative embodiments, the transmitter architecture 800 may include some or all of the elements shown in FIG. 8 and/or one or more elements may be optional and/or implemented in some configurations. For example, the STBC encoder may optionally be included, for example, when STBC is to be supported, e.g., as described above. For example, the interleaver may be included, for example, for one or more modulation schemes, e.g., as described above.

Figure 9:
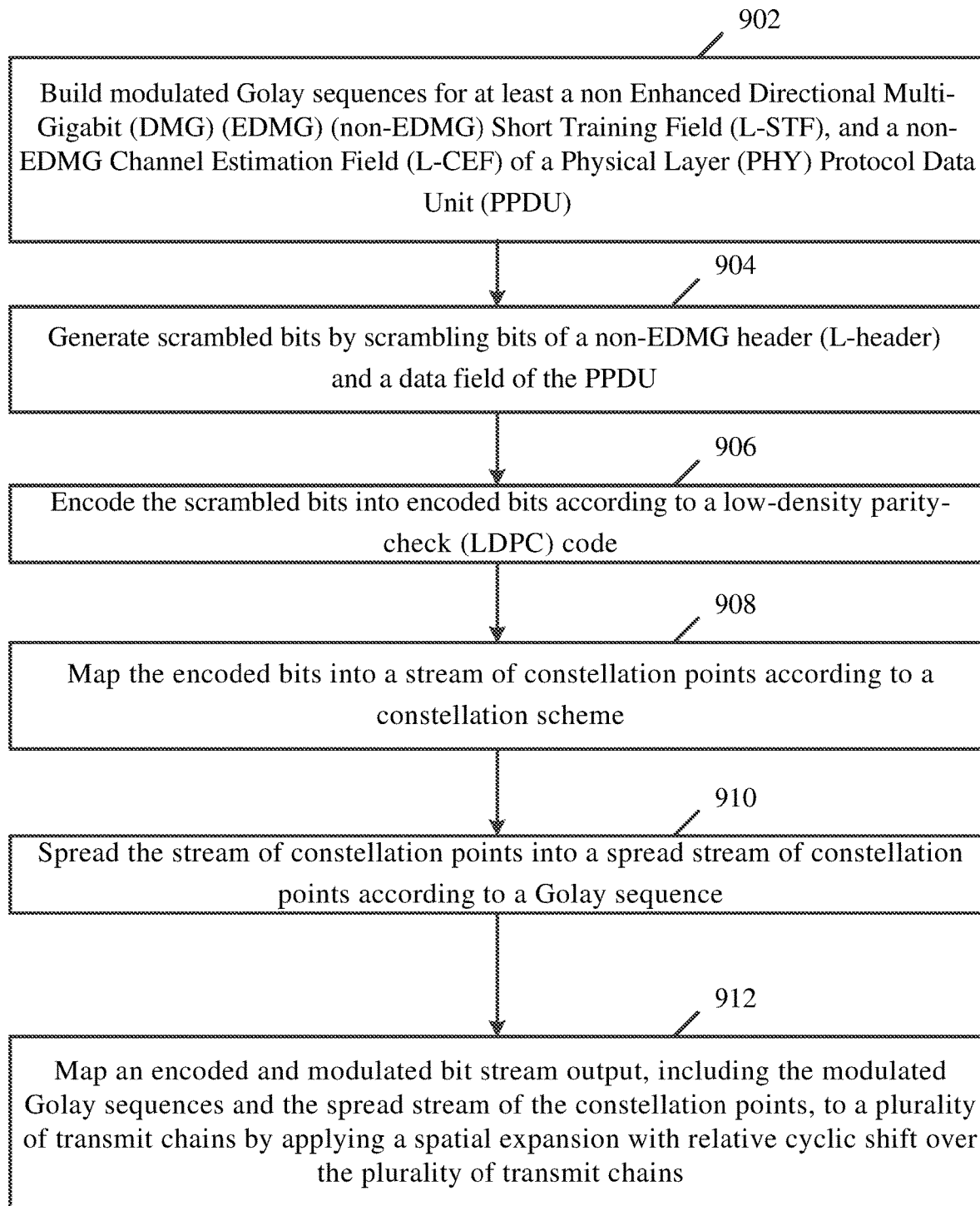
FIG. 9 is a schematic flow-chart illustration of a method of transmitting a PPDU, in accordance with some demonstrative embodiments.

Reference is made to FIG. 9, which schematically illustrates a method of transmitting a PPDU, in accordance with some demonstrative embodiments. For example, one or more of the operations of the method of FIG. 9 may be performed by one or more elements of a system, e.g., system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a transmitter, e.g., transmitter 118 (FIG. 1), and/or transmitter 148 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 902, the method may include building modulated Golay sequences for at least an L-STF, and an L-CEF of a PPDU. For example, transmitter 118 (FIG. 1) may include Golay builder 302 (FIG. 3) or Golay builder 402 (FIG. 4) configured to build modulated Golay sequences for at least L-STF 202 (FIG. 2), and L-CEF 204 (FIG. 2) of the EDMG PPDU 200 (FIG. 2), e.g., as described above.

As indicated at block 904, the method may include generating scrambled bits by scrambling bits of a non-EDMG header (L-header) and a data field of the PPDU. For example, transmitter 118 (FIG. 1) may include scrambler 304 (FIG. 3) or scrambler 404 (FIG. 4) configured to generate scrambled bits by scrambling bits of L-header 206 (FIG. 2) and a data field 218 (FIG. 2) of EDMG PPDU 200 (FIG. 2), e.g., as described above.

As indicated at block 906, the method may include encoding the scrambled bits into encoded bits according to an LDPC code. For example, transmitter 118 (FIG. 1) may include LDPC encoder 306 (FIG. 3) or LDPC encoder 406 (FIG. 4) configured to encode the scrambled bits into encoded bits according to the LDPC code, e.g., as described above.

As indicated at block 908, the method may include mapping the encoded bits into a stream of constellation points according to a constellation scheme. For example, transmitter 118 (FIG. 1) may include constellation mapper 308 (FIG. 3) or constellation mapper 408 (FIG. 4) configured to map the encoded bits into the stream of constellation points according to the constellation scheme, e.g., as described above.

As indicated at block 910, the method may include spreading the stream of constellation points according to a Golay sequence. For example, transmitter 118 (FIG. 1) may include spreader 310 (FIG. 3) or spreader 410 (FIG. 4) configured to spread the stream of constellation points according to the Golay sequence, e.g., as described above.

As indicated at block 912, the method may include mapping an encoded and modulated bit stream output, including the modulated Golay sequences and a spread stream of constellation points, to a plurality of transmit chains by applying a spatial expansion with relative cyclic shift over the plurality of transmit chains. For example, transmitter 118 (FIG. 1) may include transmit chain mapper 312 (FIG. 3) or transmit chain mapper 472 (FIG. 4) configured to map the bit stream output from Golay builder 302 (FIG. 3) or Golay builder 402 (FIG. 4) and spreader 310 (FIG. 3) or spreader 410 (FIG. 4) to the plurality of transmit chains by applying the spatial expansion with relative cyclic shift over the plurality of transmit chains, e.g., as described above.

Figure 10:
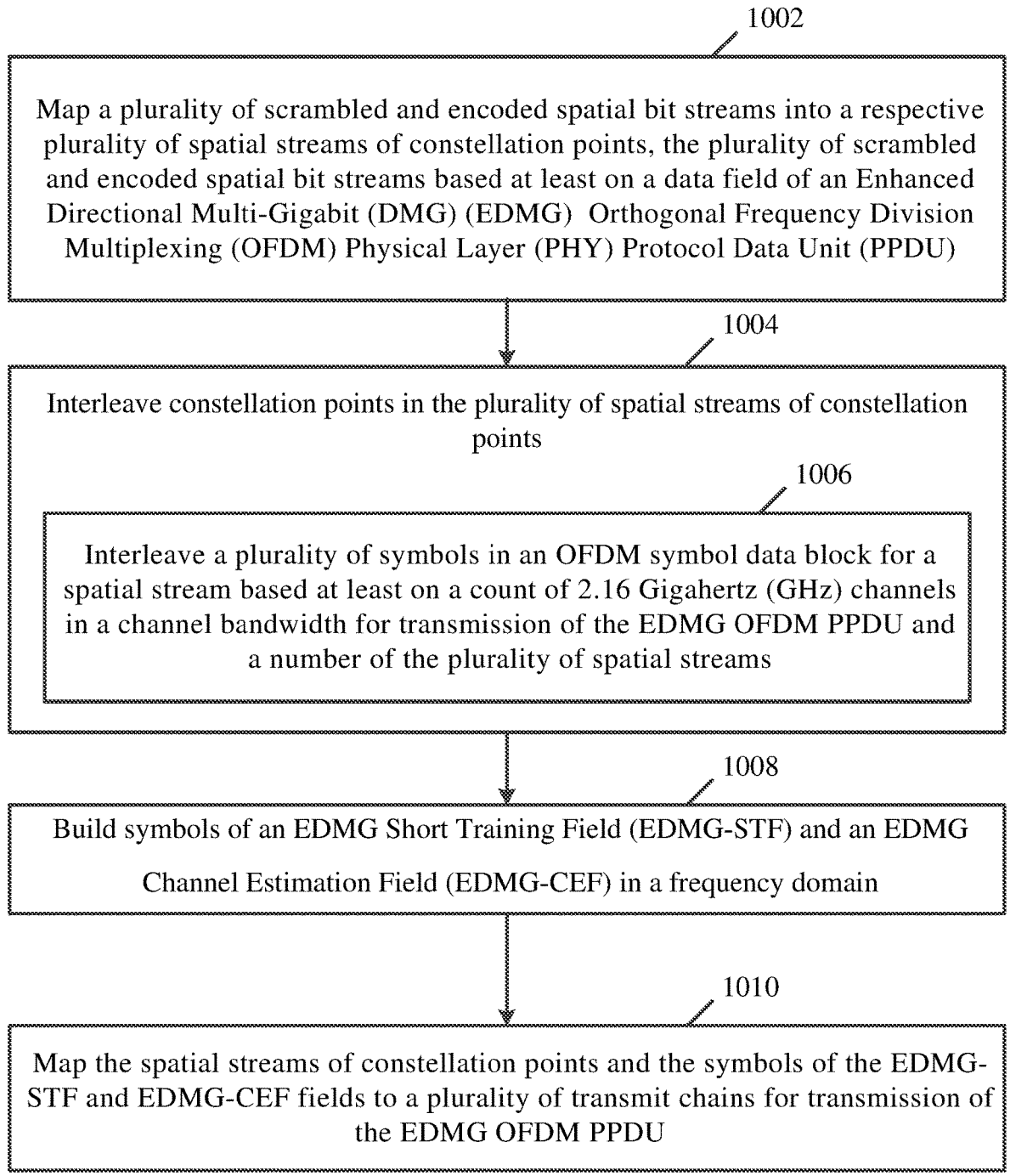
FIG. 10 is a schematic flow-chart illustration of a method of transmitting a PPDU, in accordance with some demonstrative embodiments.

Reference is made to FIG. 10, which schematically illustrates a method of transmitting a PPDU, in accordance with some demonstrative embodiments. For example, one or more of the operations of the method of FIG. 10 may be performed by one or more elements of a system, e.g., system 100 (FIG. 1), for example, one or more wireless devices, e.g., device 102 (FIG. 1), and/or device 140 (FIG. 1), a controller, e.g., controller 124 (FIG. 1) and/or controller 154 (FIG. 1), a transmitter, e.g., transmitter 118 (FIG. 1), and/or transmitter 148 (FIG. 1), a radio, e.g., radio 114 (FIG. 1) and/or radio 144 (FIG. 1), and/or a message processor, e.g., message processor 128 (FIG. 1) and/or message processor 158 (FIG. 1).

As indicated at block 1002, the method may include mapping a plurality of scrambled and encoded spatial bit streams into a respective plurality of spatial streams of constellation points. For example, transmitter 118 (FIG. 1) may include constellation mapper 512 (FIG. 5) or constellation mapper 612 (FIG. 6) configured to map the plurality of scrambled and encoded spatial bit streams into the respective plurality of spatial streams of constellation points, e.g., as described above.

In some demonstrative embodiments, the plurality of scrambled and encoded spatial bit streams may be based at least on a data field of the EDMG OFDM PPDU, e.g., as described above.

As indicated at block 1004, the method may include interleaving constellation points in the plurality of spatial streams of constellation points. For example, transmitter 118 (FIG. 1) may include interleaver 514 (FIG. 5) or interleaver 614 (FIG. 6) configured to interleave constellation points in the plurality of spatial streams of constellation points, e.g., as described above.

As indicated at block 1006, interleaving constellation points may include interleaving a plurality of symbols in an OFDM symbol data block for a spatial stream based at least on a count of 2.16 GHz channels in a channel bandwidth for transmission of the EDMG OFDM PPDU and a number of the plurality of spatial streams. For example, transmitter 118 (FIG. 1) may include interleaver 514 (FIG. 5) or interleaver 614 (FIG. 6) configured to interleave the plurality of symbols in the OFDM symbol data block for the spatial stream based at least on the count of 2.16 GHz channels in the channel bandwidth for transmission of the EDMG OFDM PPDU and the number of the plurality of spatial streams, e.g., as described above.

As indicated at block 1008, the method may include building symbols of an EDMG-STF and an EDMG-CEF in a frequency domain. For example, transmitter 118 (FIG. 1) may include preamble builder 502 (FIG. 5) or preamble builder 602 (FIG. 6) configured to build symbols of the EDMG-STF and the EDMG-CEF in the frequency domain, e.g., as described above.

As indicated at block 1010, the method may include mapping the spatial streams of constellation points and the symbols of the EDMG-STF and EDMG-CEF fields to a plurality of transmit chains for transmission of the EDMG OFDM PPDU. For example, transmitter 118 (FIG. 1) may include spatial mapper 516 (FIG. 5) or spatial mapper 616 (FIG. 6) configured to map the spatial streams of the constellation points and the symbols of the EDMG-STF 212 (FIG. 2) and EDMG-CEF 214 (FIG. 2) fields to the plurality of transmit chains for transmission of the EDMG OFDM PPDU, e.g., as described above.

Figure 11:
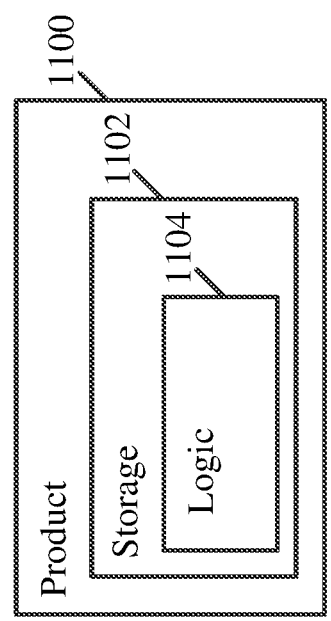
FIG. 11 is a schematic illustration of a product of manufacture, in accordance with some demonstrative embodiments.

Reference is made to FIG. 11, which schematically illustrates a product of manufacture 1100, in accordance with some demonstrative embodiments. Product 1100 may include one or more tangible computer-readable ("machine-readable") non-transitory storage media 1102, which may include computer-executable instructions, e.g., implemented by logic 1104, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1), to cause device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), message processor 128 (FIG. 1), message processor 158 (FIG. 1), controller 124 (FIG. 1), and/or controller 154 (FIG. 1) to perform, trigger and/or implement one or more operations and/or functionalities, and/or to perform, trigger and/or implement one or more operations and/or functionalities described with reference to the FIGS. 1, 2, 3, 4, 5, 6, 7, 8, 9, and/or 10, and/or one or more operations described herein. The phrases "non-transitory machine-readable medium" and "computer-readable non-transitory storage media" may be directed to include all computer-readable media, with the sole exception being a transitory propagating signal.

In some demonstrative embodiments, product 1100 and/or machine readable storage media 1102 may include one or more types of computer-readable storage media capable of storing data, including volatile memory, non-volatile memory, removable or non-removable memory, erasable or non-erasable memory, writeable or re-writeable memory, and the like. For example, machine readable storage media 1102 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 1104 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 1104 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus of a Physical Layer (PHY) Protocol Data Unit (PPDU) transmitter, the apparatus comprising a Golay builder to build modulated Golay sequences for at least a non Enhanced Directional Multi-Gigabit (DMG) (EDMG) (non-EDMG) Short Training Field (L-STF), and a non-EDMG Channel Estimation Field (L-CEF) of the PPDU; a scrambler to generate scrambled bits by scrambling bits of a non-EDMG header (L-header) and a data field of the PPDU; an encoder to encode the scrambled bits into encoded bits according to a low-density parity-check (LDPC) code; a constellation mapper to map the encoded bits into a stream of constellation points according to a constellation scheme; a spreader to spread the stream of constellation points according to a Golay sequence; and a transmit chain mapper to map a bit stream output from the Golay builder and the spreader to a plurality of transmit chains by applying a spatial expansion with relative cyclic shift over the plurality of transmit chains.

Example 2 includes the subject matter of Example 1, and optionally, comprising one or more cyclic shifters to apply a Cyclic Shift Diversity (CSD) between the plurality of transmit chains.

Example 3 includes the subject matter of Example 1 or 2, and optionally, wherein the Golay builder is configured to build one or more Training (TRN) units of the PPDU.

Example 4 includes the subject matter of any one of Examples 1-3, and optionally, wherein the PPDU comprises a non-EDMG PPDU decodable by one or more non-EDMG stations, which are DMG stations.

Example 5 includes the subject matter of Example 4, and optionally, wherein the relative cyclic shift is to be applied to one or more Training (TRN) units of the PPDU.

Example 6 includes the subject matter of any one of Examples 1-3, and optionally, wherein the PPDU comprises an EDMG PPDU comprising at least an EDMG Header (EDMG Header A) decodable by EDMG stations.

Example 7 includes the subject matter of Example 6, and optionally, wherein the apparatus is configured to map the L-CEF, the L-STF, the L-Header, the EDMG Header A, and the data field of the EDMG PPDU to the plurality of transmit chains with the relative cyclic shift, and to map one or more Training (TRN) units of the EDMG PPDU to the plurality of transmit chains without the relative cyclic shift.

Example 8 includes the subject matter of Example 6 or 7, and optionally, wherein the apparatus is configured to map to each transmit chain its own Training (TRN) unit.

Example 9 includes the subject matter of any one of Examples 6-8, and optionally, wherein the scrambler is to generate the scrambled bits by scrambling bits of the EDMG Header A.

Example 10 includes the subject matter of any one of Examples 1-9, and optionally, wherein the Golay builder is to build it/2 Binary Phase Shift Keying (BPSK) modulated Golay sequences comprising the L-STF and L-CEF.

Example 11 includes the subject matter of any one of Examples 1-10, and optionally, wherein the spreader is to spread the stream of constellation points according to a Golay sequence of length 32.

Example 12 includes the subject matter of any one of Examples 1-11, and optionally, wherein the PPDU comprises a control mode PPDU.

Example 13 includes the subject matter of any one of Examples 1-12, and optionally, wherein the apparatus is configured to transmit the PPDU via the plurality of transmit chains in a channel bandwidth over a frequency band above 45 Gigahertz (GHz).

Example 14 includes the subject matter of any one of Examples 1-13, and optionally, wherein the apparatus is configured to transmit the PPDU over a channel bandwidth of 2.16 Gigahertz (GHz), 4.32 GHz, 6.48 GHz, or 8.64 GHz.

Example 15 includes the subject matter of any one of Examples 1-14, and optionally, comprising one or more antennas, a memory, and a processor.

Example 16 includes a system of wireless communication comprising a wireless communication station, the wireless communication station comprising one or more antennas; a memory; a processor; and a Physical Layer (PHY) Protocol Data Unit (PPDU) transmitter comprising a Golay builder to build modulated Golay sequences for at least a non Enhanced Directional Multi-Gigabit (DMG) (EDMG) (non-EDMG) Short Training Field (L-STF), and a non-EDMG Channel Estimation Field (L-CEF) of the PPDU; a scrambler to generate scrambled bits by scrambling bits of a non-EDMG header (L-header) and a data field of the PPDU; an encoder to encode the scrambled bits into encoded bits according to a low-density parity-check (LDPC) code; a constellation mapper to map the encoded bits into a stream of constellation points according to a constellation scheme; a spreader to spread the stream of constellation points according to a Golay sequence; and a transmit chain mapper to map a bit stream output from the Golay builder and the spreader to a plurality of transmit chains by applying a spatial expansion with relative cyclic shift over the plurality of transmit chains.

Example 17 includes the subject matter of Example 16, and optionally, wherein the transmitter comprises one or more cyclic shifters to apply a Cyclic Shift Diversity (CSD) between the plurality of transmit chains.

Example 18 includes the subject matter of Example 16 or 17, and optionally, wherein the Golay builder is configured to build one or more Training (TRN) units of the PPDU.

Example 19 includes the subject matter of any one of Examples 16-18, and optionally, wherein the PPDU comprises a non-EDMG PPDU decodable by one or more non-EDMG stations, which are DMG stations.

Example 20 includes the subject matter of Example 19, and optionally, wherein the relative cyclic shift is to be applied to one or more Training (TRN) units of the PPDU.

Example 21 includes the subject matter of any one of Examples 16-18, and optionally, wherein the PPDU comprises an EDMG PPDU comprising at least an EDMG Header (EDMG Header A) decodable by EDMG stations.

Example 22 includes the subject matter of Example 21, and optionally, wherein the transmitter is configured to map the L-CEF, the L-STF, the L-Header, the EDMG Header A, and the data field of the EDMG PPDU to the plurality of transmit chains with the relative cyclic shift, and to map one or more Training (TRN) units of the EDMG PPDU to the plurality of transmit chains without the relative cyclic shift.

Example 23 includes the subject matter of Example 21 or 22, and optionally, wherein the transmitter is configured to map to each transmit chain its own Training (TRN) unit.

Example 24 includes the subject matter of any one of Examples 21-23, and optionally, wherein the scrambler is to generate the scrambled bits by scrambling bits of the EDMG Header A.

Example 25 includes the subject matter of any one of Examples 16-24, and optionally, wherein the Golay builder is to build it/2 Binary Phase Shift Keying (BPSK) modulated Golay sequences comprising the L-STF and L-CEF.

Example 26 includes the subject matter of any one of Examples 16-25, and optionally, wherein the spreader is to spread the stream of constellation points according to a Golay sequence of length 32.

Example 27 includes the subject matter of any one of Examples 16-26, and optionally, wherein the PPDU comprises a control mode PPDU.

Example 28 includes the subject matter of any one of Examples 16-27, and optionally, wherein the transmitter is configured to transmit the PPDU via the plurality of transmit chains in a channel bandwidth over a frequency band above 45 Gigahertz (GHz).

Example 29 includes the subject matter of any one of Examples 16-28, and optionally, wherein the transmitter is configured to transmit the PPDU over a channel bandwidth of 2.16 Gigahertz (GHz), 4.32 GHz, 6.48 GHz, or 8.64 GHz.

Example 30 includes a method to be performed at a Physical Layer (PHY) Protocol Data Unit (PPDU) transmitter, the method comprising building modulated Golay sequences for at least a non Enhanced Directional Multi-Gigabit (DMG) (EDMG) (non-EDMG) Short Training Field (L-STF), and a non-EDMG Channel Estimation Field (L-CEF) of the PPDU; generating scrambled bits by scrambling bits of a non-EDMG header (L-header) and a data field of the PPDU; encoding the scrambled bits into encoded bits according to a low-density parity-check (LDPC) code; mapping the encoded bits into a stream of constellation points according to a constellation scheme; spreading the stream of constellation points into a spread stream of constellation points according to a Golay sequence; and mapping an encoded and modulated bit stream, comprising the modulated Golay sequences and the spread stream of constellation points, to a plurality of transmit chains by applying a spatial expansion with relative cyclic shift over the plurality of transmit chains.

Example 31 includes the subject matter of Example 30, and optionally, comprising applying a Cyclic Shift Diversity (CSD) between the plurality of transmit chains.

Example 32 includes the subject matter of Example 30 or 31, and optionally, comprising building one or more Training (TRN) units of the PPDU.

Example 33 includes the subject matter of any one of Examples 30-32, and optionally, wherein the PPDU comprises a non-EDMG PPDU decodable by one or more non-EDMG stations, which are DMG stations.

Example 34 includes the subject matter of Example 33, and optionally, comprising applying the relative cyclic shift to one or more Training (TRN) units of the PPDU.

Example 35 includes the subject matter of any one of Examples 30-32, and optionally, wherein the PPDU comprises an EDMG PPDU comprising at least an EDMG Header (EDMG Header A) decodable by EDMG stations.

Example 36 includes the subject matter of Example 35, and optionally, comprising mapping the L-CEF, the L-STF, the L-Header, the EDMG Header A, and the data field of the EDMG PPDU to the plurality of transmit chains with the relative cyclic shift, and mapping one or more Training (TRN) units of the EDMG PPDU to the plurality of transmit chains without the relative cyclic shift.

Example 37 includes the subject matter of Example 35 or 36, and optionally, comprising mapping to each transmit chain its own Training (TRN) unit.

Example 38 includes the subject matter of any one of Examples 35-37, and optionally, comprising generating the scrambled bits by scrambling bits of the EDMG Header A.

Example 39 includes the subject matter of any one of Examples 30-38, and optionally, comprising building it/2 Binary Phase Shift Keying (BPSK) modulated Golay sequences comprising the L-STF and L-CEF.

Example 40 includes the subject matter of any one of Examples 30-39, and optionally, comprising spreading the stream of constellation points according to a Golay sequence of length 32.

Example 41 includes the subject matter of any one of Examples 30-40, and optionally, wherein the PPDU comprises a control mode PPDU.

Example 42 includes the subject matter of any one of Examples 30-41, and optionally, comprising transmitting the PPDU via the plurality of transmit chains in a channel bandwidth over a frequency band above 45 Gigahertz (GHz).

Example 43 includes the subject matter of any one of Examples 30-42, and optionally, comprising transmitting the PPDU over a channel bandwidth of 2.16 Gigahertz (GHz), 4.32 GHz, 6.48 GHz, or 8.64 GHz.

Example 44 includes a product comprising one or more tangible computer-readable non-transitory storage media comprising computer-executable instructions operable to, when executed by at least one processor, enable the at least one processor to cause a Physical Layer (PHY) Protocol Data Unit (PPDU) transmitter to build modulated Golay sequences for at least a non Enhanced Directional Multi-Gigabit (DMG) (EDMG) (non-EDMG) Short Training Field (L-STF), and a non-EDMG Channel Estimation Field (L-CEF) of the PPDU; generate scrambled bits by scrambling bits of a non-EDMG header (L-header) and a data field of the PPDU; encode the scrambled bits into encoded bits according to a low-density parity-check (LDPC) code; map the encoded bits into a stream of constellation points according to a constellation scheme; spread the stream of constellation points into a spread stream of constellation points according to a Golay sequence; and map an encoded and modulated bit stream, comprising the modulated Golay sequences and the spread stream of constellation points, to a plurality of transmit chains by applying a spatial expansion with relative cyclic shift over the plurality of transmit chains.

Example 45 includes the subject matter of Example 44, and optionally, wherein the instructions, when executed, cause the transmitter to apply a Cyclic Shift Diversity (CSD) between the plurality of transmit chains.

Example 46 includes the subject matter of Example 44 or 45, and optionally, wherein the instructions, when executed, cause the transmitter to build one or more Training (TRN) units of the PPDU.

Example 47 includes the subject matter of any one of Examples 44-46, and optionally, wherein the PPDU comprises a non-EDMG PPDU decodable by one or more non-EDMG stations, which are DMG stations.

Example 48 includes the subject matter of Example 47, and optionally, wherein the instructions, when executed, cause the transmitter to apply the relative cyclic shift to one or more Training (TRN) units of the PPDU.

Example 49 includes the subject matter of any one of Examples 44-46, and optionally, wherein the PPDU comprises an EDMG PPDU comprising at least an EDMG Header (EDMG Header A) decodable by EDMG stations.

Example 50 includes the subject matter of Example 49, and optionally, wherein the instructions, when executed, cause the transmitter to map the L-CEF, the L-STF, the L-Header, the EDMG Header A, and the data field of the EDMG PPDU to the plurality of transmit chains with the relative cyclic shift, and to map one or more Training (TRN) units of the EDMG PPDU to the plurality of transmit chains without the relative cyclic shift.

Example 51 includes the subject matter of Example 49 or 50, and optionally, wherein the instructions, when executed, cause the transmitter to map to each transmit chain its own Training (TRN) unit.

Example 52 includes the subject matter of any one of Examples 49-51, and optionally, wherein the instructions, when executed, cause the transmitter to generate the scrambled bits by scrambling bits of the EDMG Header A.

Example 53 includes the subject matter of any one of Examples 44-52, and optionally, wherein the instructions, when executed, cause the transmitter to build it/2 Binary Phase Shift Keying (BPSK) modulated Golay sequences comprising the L-STF and L-CEF.

Example 54 includes the subject matter of any one of Examples 44-53, and optionally, wherein the instructions, when executed, cause the transmitter to spread the stream of constellation points according to a Golay sequence of length 32.

Example 55 includes the subject matter of any one of Examples 44-54, and optionally, wherein the PPDU comprises a control mode PPDU.

Example 56 includes the subject matter of any one of Examples 44-55, and optionally, wherein the instructions, when executed, cause the transmitter to transmit the PPDU via the plurality of transmit chains in a channel bandwidth over a frequency band above 45 Gigahertz (GHz).

Example 57 includes the subject matter of any one of Examples 44-56, and optionally, wherein the instructions, when executed, cause the transmitter to transmit the PPDU over a channel bandwidth of 2.16 Gigahertz (GHz), 4.32 GHz, 6.48 GHz, or 8.64 GHz.

Example 58 includes an apparatus of wireless communication by a Physical Layer (PHY) Protocol Data Unit (PPDU) transmitter, the apparatus comprising means for building modulated Golay sequences for at least a non Enhanced Directional Multi-Gigabit (DMG) (EDMG) (non-EDMG) Short Training Field (L-STF), and a non-EDMG Channel Estimation Field (L-CEF) of the PPDU; means for generating scrambled bits by scrambling bits of a non- EDMG header (L-header) and a data field of the PPDU; means for encoding the scrambled bits into encoded bits according to a low-density parity-check (LDPC) code; means for mapping the encoded bits into a stream of constellation points according to a constellation scheme; means for spreading the stream of constellation points into a spread stream of constellation points according to a Golay sequence; and means for mapping an encoded and modulated bit stream, comprising the modulated Golay sequences and the spread stream of constellation points, to a plurality of transmit chains by applying a spatial expansion with relative cyclic shift over the plurality of transmit chains.

Example 59 includes the subject matter of Example 58, and optionally, comprising means for applying a Cyclic Shift Diversity (CSD) between the plurality of transmit chains.

Example 60 includes the subject matter of Example 58 or 59, and optionally, comprising means for building one or more Training (TRN) units of the PPDU.

Example 61 includes the subject matter of any one of Examples 58-60, and optionally, wherein the PPDU comprises a non-EDMG PPDU decodable by one or more non-EDMG stations, which are DMG stations.

Example 62 includes the subject matter of Example 61, and optionally, comprising means for applying the relative cyclic shift to one or more Training (TRN) units of the PPDU.

Example 63 includes the subject matter of any one of Examples 58-60, and optionally, wherein the PPDU comprises an EDMG PPDU comprising at least an EDMG Header (EDMG Header A) decodable by EDMG stations.

Example 64 includes the subject matter of Example 63, and optionally, comprising means for mapping the L-CEF, the L-STF, the L-Header, the EDMG Header A, and the data field of the EDMG PPDU to the plurality of transmit chains with the relative cyclic shift, and mapping one or more Training (TRN) units of the EDMG PPDU to the plurality of transmit chains without the relative cyclic shift.

Example 65 includes the subject matter of Example 63 or 64, and optionally, comprising means for mapping to each transmit chain its own Training (TRN) unit.

Example 66 includes the subject matter of any one of Examples 63-65, and optionally, comprising means for generating the scrambled bits by scrambling bits of the EDMG Header A.

Example 67 includes the subject matter of any one of Examples 58-66, and optionally, comprising means for building it/2 Binary Phase Shift Keying (BPSK) modulated Golay sequences comprising the L-STF and L-CEF.

Example 68 includes the subject matter of any one of Examples 58-67, and optionally, comprising means for spreading the stream of constellation points according to a Golay sequence of length 32.

Example 69 includes the subject matter of any one of Examples 58-68, and optionally, wherein the PPDU comprises a control mode PPDU.

Example 70 includes the subject matter of any one of Examples 58-69, and optionally, comprising means for transmitting the PPDU via the plurality of transmit chains in a channel bandwidth over a frequency band above 45 Gigahertz (GHz).

Example 71 includes the subject matter of any one of Examples 58-70, and optionally, comprising means for transmitting the PPDU over a channel bandwidth of 2.16 Gigahertz (GHz), 4.32 GHz, 6.48 GHz, or 8.64 GHz.

Example 72 includes an apparatus of an Enhanced Directional Multi-Gigabit (DMG) (EDMG) Orthogonal Frequency Division Multiplexing (OFDM) Physical Layer (PHY) Protocol Data Unit (PPDU) transmitter, the apparatus comprising a constellation mapper to map a plurality of scrambled and encoded spatial bit streams into a respective plurality of spatial streams of constellation points, the plurality of scrambled and encoded spatial bit streams based at least on a data field of the EDMG OFDM PPDU; a symbol interleaver to interleave constellation points in the plurality of spatial streams of constellation points, the interleaver to interleave a plurality of symbols in an OFDM symbol data block for a spatial stream based at least on a count of 2.16 Gigahertz (GHz) channels in a channel bandwidth for transmission of the EDMG OFDM PPDU and a count of the plurality of spatial streams; a preamble builder to build symbols of an EDMG Short Training Field (EDMG-STF) and an EDMG Channel Estimation Field (EDMG-CEF) in a frequency domain; and a spatial mapper to map the spatial streams of constellation points and the symbols of the EDMG-STF and EDMG-CEF fields to a plurality of transmit chains for transmission of the EDMG OFDM PPDU.

Example 73 includes the subject matter of Example 72, and optionally, wherein the OFDM symbol data block comprises a plurality of data symbols in an OFDM symbol of the spatial stream and a plurality of padded zeros.

Example 74 includes the subject matter of Example 73, and optionally, wherein the interleaver is to generate a permuted OFDM data block by permuting the OFDM data block according to an array of permutation indexes, the array of permutation indexes is based on a first permutation parameter and a second permutation parameter, the first permutation parameter is based at least on the count of 2.16 GHz channels in the channel bandwidth, the second permutation parameter is based on a count of data subcarriers per OFDM symbol, a count of the plurality of padded zeros and the first permutation parameter.

Example 75 includes the subject matter of Example 74, and optionally, wherein the interleaver is to permute an OFDM data block, denoted $d_{in}^{(i_{SS},q)}$, corresponding to an OFDM symbol number q in an $i_{SS}$-th spatial stream, into a permuted OFDM symbol, denoted $d_{out}^{(i_{SS},q)}$, as follows:

$$d_{out}^{(i_{SS},q)} = (d_{idx(0)}^{(i_{SS},q)}, d_{idx(1)}^{(i_{SS},q)}, \ldots, d_{idx((N_{SD}+N_P)-1)}^{(i_{SS},q)})$$

wherein:

$$d_{in}^{(i_{SS},q)} = (d_0^{(i_{SS},q)}, d_1^{(i_{SS},q)}, \ldots, d_{N_{SD}-1}^{(i_{SS},q)}, 0_0, 0_1, \ldots, 0_{N_P-1})$$

wherein $N_{SD}$ denotes the count of data subcarriers per OFDM symbol, $N_P$ denotes the count of the plurality of padded zeros, and idx( ) denotes a permutation index in the array of permutation indexes.

Example 76 includes the subject matter of Example 74 or 75, and optionally, wherein the array of permutation indexes, denoted idx, is defined as follows:

$$idx(j \times N_x + i) = N_y \times i + j, \text{ where}$$

$$i = 0, 1, \ldots, N_x - 1 \text{ and } j = 0, 1, \ldots, N_y - 1$$

$$x = \left( (N_{SD} + N_p) \times \sum_{i_{SS}=1}^{N_{SS_{user}}} N_{BPSC_{user}i_{SS}} \right) / L_{CW_{user}}$$

wherein:

$x < 2.5 \times N_{CB} : N_x = 2 \times N_{CB}$ $2.5 \times N_{CB} \leq x < 3.5 \times N_{CB} : N_x = 3 \times N_{CB}$ $3.5 \times N_{CB} \leq x < 5 \times N_{CB} : N_x = 4 \times N_{CB}$ $5 \times N_{CB} \leq x < 7 \times N_{CB} : N_x = 6 \times N_{CB}$ $7 \times N_{CB} \leq x < 10 \times N_{CB} : N_x = 8 \times N_{CB}$ $10 \times N_{CB} \leq x < 14 \times N_{CB} : N_x = 12 \times N_{CB}$ $14 \times N_{CB} \leq x < 20 \times N_{CB} : N_x = 16 \times N_{CB}$ $x \geq 20 \times N_{CB} : N_x = 24 \times N_{CB}$ wherein:

$N_y = (N_{SD} \pm N_P) / N_x$ wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS\ i_{user}}$ a count of spatial streams for an $i_{user}$-th user, $N_{BPSC\ i_{user}\ i_{SS}}$ denotes a count of coded bits per constellation point for the $i_{user}$-th user and an $i_{SS}$-th spatial stream, and $L_{CW\ i_{user}}$ denotes a low-density parity-check (LDPC) codeword length for the $i_{user}$-th user.

Example 77 includes the subject matter of any one of Examples 72-76, and optionally, wherein the plurality of symbols in the OFDM symbol data block comprise 16 Quadrature Amplitude Modulation (QAM) or 64-QAM symbols.

Example 78 includes the subject matter of any one of Examples 72-77, and optionally, comprising a scrambler to generate scrambled bits by scrambling data bits of the data field of the EDMG OFDM PPDU, and an encoder to encode the scrambled bits into encoded bits according to a low-density parity-check (LDPC) code.

Example 79 includes the subject matter of any one of Examples 72-78, and optionally, comprising a Space Time Block Code (STBC) encoder to spread constellation points from the plurality of spatial streams into a plurality of space-time streams.

Example 80 includes the subject matter of any one of Examples 72-79, and optionally, comprising a Training (TRN) builder to build one or more TRN units of the EDMG OFDM PPDU.

Example 81 includes the subject matter of any one of Examples 72-80, and optionally, wherein the PPDU comprises a Single User (SU) PPDU.

Example 82 includes the subject matter of any one of Examples 72-80, and optionally, wherein the PPDU comprises a Multi User (MU) PPDU.

Example 83 includes the subject matter of Example 82, and optionally, wherein the apparatus is configured to process a plurality of EDMG PPDU portions of the EDMG MU PPDU to be transmitted to a respective plurality of users, the constellation mapper to map a plurality of scrambled and encoded spatial bit streams for a user into a respective plurality of spatial streams of constellation points for the user, the symbol interleaver to interleave constellation points in the plurality of spatial streams of constellation points for the user, the spatial mapper to map to the plurality of transmit chains a plurality of user spatial streams, the plurality of user spatial streams comprising one or more spatial streams for each user of the plurality of users.

Example 84 includes the subject matter of Example 83, and optionally, wherein the plurality of scrambled and encoded spatial bit streams for the user are based on bits of an EDMG Header (EDMG Header B) for the user and a data field for the user.

Example 85 includes the subject matter of any one of Examples 72-84, and optionally, wherein the apparatus is configured to transmit the EDMG OFDM PPDU via the plurality of transmit chains in the channel bandwidth over a frequency band above 45 GHz.

Example 86 includes the subject matter of any one of Examples 72-85, and optionally, wherein the apparatus is configured to transmit the EDMG OFDM PPDU over a channel bandwidth of 2.16 GHz, 4.32 GHz, 6.48 GHz, or 8.64 GHz.

Example 87 includes the subject matter of any one of Examples 72-86, and optionally, comprising one or more antennas, a memory, and a processor.

Example 88 includes a system of wireless communication comprising a wireless communication station, the wireless communication station comprising one or more antennas; a memory; a processor; and an Enhanced Directional Multi-Gigabit (DMG) (EDMG) Orthogonal Frequency Division Multiplexing (OFDM) Physical Layer (PHY) Protocol Data Unit (PPDU) transmitter comprising a constellation mapper to map a plurality of scrambled and encoded spatial bit streams into a respective plurality of spatial streams of constellation points, the plurality of scrambled and encoded spatial bit streams based at least on a data field of the EDMG OFDM PPDU; a symbol interleaver to interleave constellation points in the plurality of spatial streams of constellation points, the interleaver to interleave a plurality of symbols in an OFDM symbol data block for a spatial stream based at least on a count of 2.16 Gigahertz (GHz) channels in a channel bandwidth for transmission of the EDMG OFDM PPDU and a count of the plurality of spatial streams; a preamble builder to build symbols of an EDMG Short Training Field (EDMG-STF) and an EDMG Channel Estimation Field (EDMG-CEF) in a frequency domain; and a spatial mapper to map the spatial streams of constellation points and the symbols of the EDMG-STF and EDMG-CEF fields to a plurality of transmit chains for transmission of the EDMG OFDM PPDU.

Example 89 includes the subject matter of Example 88, and optionally, wherein the OFDM symbol data block comprises a plurality of data symbols in an OFDM symbol of the spatial stream and a plurality of padded zeros.

Example 90 includes the subject matter of Example 89, and optionally, wherein the interleaver is to generate a permuted OFDM data block by permuting the OFDM data block according to an array of permutation indexes, the array of permutation indexes is based on a first permutation parameter and a second permutation parameter, the first permutation parameter is based at least on the count of 2.16 GHz channels in the channel bandwidth, the second permutation parameter is based on a count of data subcarriers per OFDM symbol, a count of the plurality of padded zeros and the first permutation parameter.

Example 91 includes the subject matter of Example 90, and optionally, wherein the interleaver is to permute an OFDM data block, denoted $d_{in}^{(iss,q)}$, corresponding to an OFDM symbol number q in an $i_{SS}$-th spatial stream, into a permuted OFDM symbol, denoted $d_{out}^{(iss,q)}$, as follows:

$d_{out}^{(iss,q)} = (d_{idx(0)}^{(iss,q)}, d_{idx(1)}^{(iss,q)}, \ldots, d_{idx((N_{SD}+N_P)-1)}^{(iss,q)})$ wherein:

$d_{in}^{(iss,q)} = (d_0^{(iss,q)}, d_1^{(iss,q)}, \ldots, d_{N_{SD}-1}^{(iss,q)}, 0_0, 0_1, \ldots, 0_{N_P-1})$ wherein $N_{SD}$ denotes the count of data subcarriers per OFDM symbol, $N_P$ denotes the count of the plurality of padded zeros, and idx( ) denotes a permutation index in the array of permutation indexes.

Example 92 includes the subject matter of Example 90 or 91, and optionally, wherein the array of permutation indexes, denoted idx, is defined as follows:

$$idx(j \times N_x + i) = N_y \times i + j, \text{ where}$$

$$i = 0, 1, \ldots, N_x - 1 \text{ and } j = 0, 1, \ldots, N_y - 1$$

$$x = \left((N_{SD} + N_P) \times \sum_{i_{SS}=1}^{N_{SS_{i_{user}}}} N_{BPSC_{i_{user}} i_{SS}}\right) / L_{CW_{i_{user}}}$$

wherein:

$x < 2.5 \times N_{CB} : N_x = 2 \times N_{CB}$ $2.5 \times N_{CB} \leq x < 3.5 \times N_{CB} : N_x = 3 \times N_{CB}$ $3.5 \times N_{CB} \leq x < 5 \times N_{CB} : N_x = 4 \times N_{CB}$ $5 \times N_{CB} \leq x < 7 \times N_{CB} : N_x = 6 \times N_{CB}$ $7 \times N_{CB} \leq x < 10 \times N_{CB} : N_x = 8 \times N_{CB}$ $10 \times N_{CB} \leq x < 14 \times N_{CB} : N_x = 12 \times N_{CB}$ $14 \times N_{CB} \leq x < 20 \times N_{CB} : N_x = 16 \times N_{CB}$ $x \geq 20 \times N_{CB} : N_x = 24 \times N_{CB}$ wherein:

$N_y = (N_{SD} \pm N_P)/N_x$ wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS\ i_{user}}$ a count of spatial streams for an $i_{user}$-th user, $N_{BPSC\ i_{user}\ i_{SS}}$ denotes a count of coded bits per constellation point for the $i_{user}$-th user and an $i_{SS}$-th spatial stream, and $L_{CW\ i_{user}}$ denotes a low-density parity-check (LDPC) codeword length for the $i_{user}$-th user.

Example 93 includes the subject matter of any one of Examples 88-92, and optionally, wherein the plurality of symbols in the OFDM symbol data block comprise 16 Quadrature Amplitude Modulation (QAM) or 64-QAM symbols.

Example 94 includes the subject matter of any one of Examples 88-93, and optionally, wherein the transmitter comprises a scrambler to generate scrambled bits by scrambling data bits of the data field of the EDMG OFDM PPDU, and an encoder to encode the scrambled bits into encoded bits according to a low-density parity-check (LDPC) code.

Example 95 includes the subject matter of any one of Examples 88-94, and optionally, wherein the transmitter comprises a Space Time Block Code (STBC) encoder to spread constellation points from the plurality of spatial streams into a plurality of space-time streams.

Example 96 includes the subject matter of any one of Examples 88-95, and optionally, wherein the transmitter comprises a Training (TRN) builder to build one or more TRN units of the EDMG OFDM PPDU.

Example 97 includes the subject matter of any one of Examples 88-96, and optionally, wherein the PPDU comprises a Single User (SU) PPDU.

Example 98 includes the subject matter of any one of Examples 88-96, and optionally, wherein the PPDU comprises a Multi User (MU) PPDU.

Example 99 includes the subject matter of Example 98, and optionally, wherein the transmitter is configured to process a plurality of EDMG PPDU portions of the EDMG MU PPDU to be transmitted to a respective plurality of users, the constellation mapper to map a plurality of scrambled and encoded spatial bit streams for a user into a respective plurality of spatial streams of constellation points for the user, the symbol interleaver to interleave constellation points in the plurality of spatial streams of constellation points for the user, the spatial mapper to map to the plurality of transmit chains a plurality of user spatial streams, the plurality of user spatial streams comprising one or more spatial streams for each user of the plurality of users.

Example 100 includes the subject matter of Example 99, and optionally, wherein the plurality of scrambled and encoded spatial bit streams for the user are based on bits of an EDMG Header (EDMG Header B) for the user and a data field for the user.

Example 101 includes the subject matter of any one of Examples 88-100, and optionally, wherein the transmitter is configured to transmit the EDMG OFDM PPDU via the plurality of transmit chains in the channel bandwidth over a frequency band above 45 GHz.

Example 102 includes the subject matter of any one of Examples 88-101, and optionally, wherein the transmitter is configured to transmit the EDMG OFDM PPDU over a channel bandwidth of 2.16 GHz, 4.32 GHz, 6.48 GHz, or 8.64 GHz.

Example 103 includes a method to be performed at an Enhanced Directional Multi-Gigabit (DMG) (EDMG) Orthogonal Frequency Division Multiplexing (OFDM) Physical Layer (PHY) Protocol Data Unit (PPDU) transmitter, the method comprising mapping a plurality of scrambled and encoded spatial bit streams into a respective plurality of spatial streams of constellation points, the plurality of scrambled and encoded spatial bit streams based at least on a data field of the EDMG OFDM PPDU; interleaving constellation points in the plurality of spatial streams of constellation points by interleaving a plurality of symbols in an OFDM symbol data block for a spatial stream based at least on a count of 2.16 Gigahertz (GHz) channels in a channel bandwidth for transmission of the EDMG OFDM PPDU and a count of the plurality of spatial streams; building symbols of an EDMG Short Training Field (EDMG-STF) and an EDMG Channel Estimation Field (EDMG-CEF) in a frequency domain; and mapping the spatial streams of constellation points and the symbols of the EDMG-STF and EDMG-CEF fields to a plurality of transmit chains for transmission of the EDMG OFDM PPDU.

Example 104 includes the subject matter of Example 103, and optionally, wherein the OFDM symbol data block comprises a plurality of data symbols in an OFDM symbol of the spatial stream and a plurality of padded zeros.

Example 105 includes the subject matter of Example 104, and optionally, comprising generating a permuted OFDM data block by permuting the OFDM data block according to an array of permutation indexes, the array of permutation indexes is based on a first permutation parameter and a second permutation parameter, the first permutation parameter is based at least on the count of 2.16 GHz channels in the channel bandwidth, the second permutation parameter is based on a count of data subcarriers per OFDM symbol, a count of the plurality of padded zeros and the first permutation parameter.

Example 106 includes the subject matter of Example 105, and optionally, comprising permuting an OFDM data block, denoted $d_{in}^{(iSS,q)}$, corresponding to an OFDM symbol number q in an $i_{SS}$-th spatial stream, into a permuted OFDM symbol, denoted $d_{out}^{(iSS,q)}$, as follows:

$$d_{out}^{(iSS,q)} = (d_{idx(0)}^{(iSS,q)}, d_{idx(1)}^{(iSS,q)}, \ldots, d_{idx((N_{SD}+N_P)-1)}^{(iSS,q)})$$

wherein:

$$d_{in}^{(iSS,q)} = (d_0^{(iSS,q)}, d_1^{(iSS,q)}, \ldots, d_{N_{SD}-1}^{(iSS,q)}, 0_0, 0_1, \ldots, 0_{N_P-1})$$

wherein $N_{SD}$ denotes the count of data subcarriers per OFDM symbol, $N_P$ denotes the count of the plurality of padded zeros, and idx( ) denotes a permutation index in the array of permutation indexes.

Example 107 includes the subject matter of Example 105 or 106, and optionally, wherein the array of permutation indexes, denoted idx, is defined as follows:

$$idx(j \times N_x + i) = N_y \times i + j, \text{ where}$$
$$i = 0, 1, \ldots, N_x - 1 \text{ and } j = 0, 1, \ldots, N_y - 1$$

$$x = \left( (N_{SD} + N_P) \times \sum_{i_{SS}=1}^{N_{SS_{i_{user}}}} N_{BPSC_{i_{user}} i_{SS}} \right) / L_{CW_{i_{user}}}$$

wherein:

$$x < 2.5 \times N_{CB} : N_x = 2 \times N_{CB}$$
$$2.5 \times N_{CB} \leq x < 3.5 \times N_{CB} : N_x = 3 \times N_{CB}$$
$$3.5 \times N_{CB} \leq x < 5 \times N_{CB} : N_x = 4 \times N_{CB}$$
$$5 \times N_{CB} \leq x < 7 \times N_{CB} : N_x = 6 \times N_{CB}$$
$$7 \times N_{CB} \leq x < 10 \times N_{CB} : N_x = 8 \times N_{CB}$$
$$10 \times N_{CB} \leq x < 14 \times N_{CB} : N_x = 12 \times N_{CB}$$
$$14 \times N_{CB} \leq x < 20 \times N_{CB} : N_x = 16 \times N_{CB}$$
$$x \geq 20 \times N_{CB} : N_x = 24 \times N_{CB}$$

wherein:

$$N_y = (N_{SD} \pm N_P) / N_x$$

wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS_{i_{user}}}$ denotes a count of spatial streams for an $i_{user}$-th user, $N_{BPSC_{i_{user}} i_{SS}}$ denotes a count of coded bits per constellation point for the $i_{user}$-th user and an $i_{SS}$-th spatial stream, and $L_{CW_{i_{user}}}$ denotes a low-density parity-check (LDPC) codeword length for the $i_{user}$-th user.

Example 108 includes the subject matter of any one of Examples 103-107, and optionally, wherein the plurality of symbols in the OFDM symbol data block comprise 16 Quadrature Amplitude Modulation (QAM) or 64-QAM symbols.

Example 109 includes the subject matter of any one of Examples 103-108, and optionally, comprising generating scrambled bits by scrambling data bits of the data field of the EDMG OFDM PPDU, and encoding the scrambled bits into encoded bits according to a low-density parity-check (LDPC) code.

Example 110 includes the subject matter of any one of Examples 103-109, and optionally, comprising spreading constellation points from the plurality of spatial streams into a plurality of space-time streams according to a Space Time Block Code (STBC).

Example 111 includes the subject matter of any one of Examples 103-110, and optionally, comprising building one or more Training (TRN) units of the EDMG OFDM PPDU.

Example 112 includes the subject matter of any one of Examples 103-111, and optionally, wherein the PPDU comprises a Single User (SU) PPDU.

Example 113 includes the subject matter of any one of Examples 103-111, and optionally, wherein the PPDU comprises a Multi User (MU) PPDU.

Example 114 includes the subject matter of Example 113, and optionally, comprising processing a plurality of EDMG PPDU portions of the EDMG MU PPDU to be transmitted to a respective plurality of users, mapping a plurality of scrambled and encoded spatial bit streams for a user into a respective plurality of spatial streams of constellation points for the user, interleaving constellation points in the plurality of spatial streams of constellation points for the user, and mapping to the plurality of transmit chains a plurality of user spatial streams, the plurality of user spatial streams comprising one or more spatial streams for each user of the plurality of users.

Example 115 includes the subject matter of Example 114, and optionally, wherein the plurality of scrambled and encoded spatial bit streams for the user are based on bits of an EDMG Header (EDMG Header B) for the user and a data field for the user.

Example 116 includes the subject matter of any one of Examples 103-115, and optionally, comprising transmitting the EDMG OFDM PPDU via the plurality of transmit chains in the channel bandwidth over a frequency band above 45 GHz.

Example 117 includes the subject matter of any one of Examples 103-116, and optionally, comprising transmitting the EDMG OFDM PPDU over a channel bandwidth of 2.16 GHz, 4.32 GHz, 6.48 GHz, or 8.64 GHz.

Example 118 includes a product comprising one or more tangible computer-readable non-transitory storage media comprising computer-executable instructions operable to, when executed by at least one processor, enable the at least one processor to cause an Enhanced Directional Multi-Gigabit (DMG) (EDMG) Orthogonal Frequency Division Multiplexing (OFDM) Physical Layer (PHY) Protocol Data Unit (PPDU) transmitter to map a plurality of scrambled and encoded spatial bit streams into a respective plurality of spatial streams of constellation points, the plurality of scrambled and encoded spatial bit streams based at least on a data field of the EDMG OFDM PPDU; interleave constellation points in the plurality of spatial streams of constellation points by interleaving a plurality of symbols in an OFDM symbol data block for a spatial stream based at least on a count of 2.16 Gigahertz (GHz) channels in a channel bandwidth for transmission of the EDMG OFDM PPDU and a number of the plurality of spatial streams; build symbols of an EDMG Short Training Field (EDMG-STF) and an EDMG Channel Estimation Field (EDMG-CEF) in a frequency domain; and map the spatial streams of constellation points and the symbols of the EDMG-STF and EDMG-CEF fields to a plurality of transmit chains for transmission of the EDMG OFDM PPDU.

Example 119 includes the subject matter of Example 118, and optionally, wherein the OFDM symbol data block comprises a plurality of data symbols in an OFDM symbol of the spatial stream and a plurality of padded zeros.

Example 120 includes the subject matter of Example 119, and optionally, wherein the instructions, when executed, cause the transmitter to generate a permuted OFDM data block by permuting the OFDM data block according to an array of permutation indexes, the array of permutation indexes is based on a first permutation parameter and a second permutation parameter, the first permutation parameter is based at least on the count of 2.16 GHz channels in the channel bandwidth, the second permutation parameter is based on a count of data subcarriers per OFDM symbol, a count of the plurality of padded zeros and the first permutation parameter.

Example 121 includes the subject matter of Example 120, and optionally, wherein the instructions, when executed, cause the transmitter to permute an OFDM data block, denoted $d_{in}^{(iSS,q)}$, corresponding to an OFDM symbol number q in an $i_{SS}$-th spatial stream, into a permuted OFDM symbol, denoted $d_{out}^{(iSS,q)}$, as follows:

$$d_{out}^{(iSS,q)} = (d_{idx(0)}^{(iSS,q)}, d_{idx(1)}^{(iSS,q)}, \ldots, d_{idx(N_{SD}+N_P)-1)}^{(iSS,q)})$$

wherein:

$$d_{in}^{(iSS,q)} = (d_0^{(iSS,q)}, d_1^{(iSS,q)}, \ldots, d_{N_{SD}-1}^{(iSS,q)}, 0_0, 0_1, \ldots, 0_{N_P-1})$$

wherein $N_{SD}$ denotes the count of data subcarriers per OFDM symbol, $N_P$ denotes the count of the plurality of padded zeros, and idx( ) denotes a permutation index in the array of permutation indexes.

Example 122 includes the subject matter of Example 120 or 121, and optionally, wherein the array of permutation indexes, denoted idx, is defined as follows:

$$idx(j \times N_x + i) = N_y \times i + j, \text{ where}$$

$$i = 0, 1, \ldots, N_x - 1 \text{ and } j = 0, 1, \ldots, N_y - 1$$

$$x = \left((N_{SD} + N_P) \times \sum_{i_{SS}=1}^{N_{SS_{i_{user}}}} N_{BPSC_{i_{user} i_{SS}}}\right) / L_{CW_{i_{user}}}$$

wherein:

$x < 2.5 \times N_{CB}: N_x = 2 \times N_{CB}$ $2.5 \times N_{CB} \leq x < 3.5 \times N_{CB}: N_x = 3 \times N_{CB}$ $3.5 \times N_{CB} \leq x < 5 \times N_{CB}: N_x = 4 \times N_{CB}$ $5 \times N_{CB} \leq x < 7 \times N_{CB}: N_x = 6 \times N_{CB}$ $7 \times N_{CB} \leq x < 10 \times N_{CB}: N_x = 8 \times N_{CB}$ $10 \times N_{CB} \leq x < 14 \times N_{CB}: N_x = 12 \times N_{CB}$ $14 \times N_{CB} \leq x < 20 \times N_{CB}: N_x = 16 \times N_{CB}$ $x \geq 20 \times N_{CB}: N_x = 24 \times N_{CB}$ wherein:

$N_y = (N_{SD} \pm N_P) / N_x$ wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS_{i_{user}}}$ a count of spatial streams for an $i_{user}$-th user, $N_{BPSC_{i_{user} i_{SS}}}$ denotes a count of coded bits per constellation point for the $i_{user}$-th user and an $i_{SS}$-th spatial stream, and $L_{CW_{i_{user}}}$ denotes a low-density parity-check (LDPC) codeword length for the $i_{user}$-th user.

Example 123 includes the subject matter of any one of Examples 118-122, and optionally, wherein the plurality of symbols in the OFDM symbol data block comprise 16 Quadrature Amplitude Modulation (QAM) or 64-QAM symbols.

Example 124 includes the subject matter of any one of Examples 118-123, and optionally, wherein the instructions, when executed, cause the transmitter to generate scrambled bits by scrambling data bits of the data field of the EDMG OFDM PPDU, and encode the scrambled bits into encoded bits according to a low-density parity-check (LDPC) code.

Example 125 includes the subject matter of any one of Examples 118-124, and optionally, wherein the instructions, when executed, cause the transmitter to spread constellation points from the plurality of spatial streams into a plurality of space-time streams according to a Space Time Block Code (STBC).

Example 126 includes the subject matter of any one of Examples 118-125, and optionally, wherein the instructions, when executed, cause the transmitter to build one or more Training (TRN) units of the EDMG OFDM PPDU.

Example 127 includes the subject matter of any one of Examples 118-126, and optionally, wherein the PPDU comprises a Single User (SU) PPDU.

Example 128 includes the subject matter of any one of Examples 118-126, and optionally, wherein the PPDU comprises a Multi User (MU) PPDU.

Example 129 includes the subject matter of Example 128, and optionally, wherein the instructions, when executed, cause the transmitter to process a plurality of EDMG PPDU portions of the EDMG MU PPDU to be transmitted to a respective plurality of users, map a plurality of scrambled and encoded spatial bit streams for a user into a respective plurality of spatial streams of constellation points for the user, interleave constellation points in the plurality of spatial streams of constellation points for the user, and map to the plurality of transmit chains a plurality of user spatial streams, the plurality of user spatial streams comprising one or more spatial streams for each user of the plurality of users.

Example 130 includes the subject matter of Example 129, and optionally, wherein the plurality of scrambled and encoded spatial bit streams for the user are based on bits of an EDMG Header (EDMG Header B) for the user and a data field for the user.

Example 131 includes the subject matter of any one of Examples 118-130, and optionally, wherein the instructions, when executed, cause the transmitter to transmit the EDMG OFDM PPDU via the plurality of transmit chains in the channel bandwidth over a frequency band above 45 GHz.

Example 132 includes the subject matter of any one of Examples 118-131, and optionally, wherein the instructions, when executed, cause the transmitter to transmit the EDMG OFDM PPDU over a channel bandwidth of 2.16 GHz, 4.32 GHz, 6.48 GHz, or 8.64 GHz.

Example 133 includes an apparatus of wireless communication by an Enhanced Directional Multi-Gigabit (DMG) (EDMG) Orthogonal Frequency Division Multiplexing (OFDM) Physical Layer (PHY) Protocol Data Unit (PPDU) transmitter, the apparatus comprising means for mapping a plurality of scrambled and encoded spatial bit streams into a respective plurality of spatial streams of constellation points, the plurality of scrambled and encoded spatial bit streams based at least on a data field of the EDMG OFDM PPDU; means for interleaving constellation points in the plurality of spatial streams of constellation points by interleaving a plurality of symbols in an OFDM symbol data block for a spatial stream based at least on a count of 2.16 Gigahertz (GHz) channels in a channel bandwidth for transmission of the EDMG OFDM PPDU and a number of the plurality of spatial streams; means for building symbols of an EDMG Short Training Field (EDMG-STF) and an EDMG Channel Estimation Field (EDMG-CEF) in a frequency domain; and means for mapping the spatial streams of constellation points and the symbols of the EDMG-STF and EDMG-CEF fields to a plurality of transmit chains for transmission of the EDMG OFDM PPDU.

Example 134 includes the subject matter of Example 133, and optionally, wherein the OFDM symbol data block comprises a plurality of data symbols in an OFDM symbol of the spatial stream and a plurality of padded zeros.

Example 135 includes the subject matter of Example 134, and optionally, comprising means for generating a permuted OFDM data block by permuting the OFDM data block according to an array of permutation indexes, the array of permutation indexes is based on a first permutation parameter and a second permutation parameter, the first permutation parameter is based at least on the count of 2.16 GHz channels in the channel bandwidth, the second permutation parameter is based on a count of data subcarriers per OFDM symbol, a count of the plurality of padded zeros and the first permutation parameter.

Example 136 includes the subject matter of Example 135, and optionally, comprising means for permuting an OFDM data block, denoted $d_{in}^{(i_{SS},q)}$, corresponding to an OFDM symbol number q in an $i_{SS}$-th spatial stream, into a permuted OFDM symbol, denoted $d_{out}^{(i_{SS},q)}$, as follows:

$$d_{out}^{(i_{SS},q)} = (d_{idx(0)}^{(i_{SS},q)}, d_{idx(1)}^{(i_{SS},q)}, \ldots, d_{idx(N_{SD}+N_P)-1)}^{(i_{SS},q)})$$

wherein:

$$d_{in}^{(i_{SS},q)} = (d_0^{(i_{SS},q)}, d_1^{(i_{SS},q)}, \ldots, d_{N_{SD}-1}^{(i_{SS},q)}, 0_0, 0_1, \ldots, 0_{N_P-1})$$

wherein $N_{SD}$ denotes the count of data subcarriers per OFDM symbol, $N_P$ denotes the count of the plurality of padded zeros, and idx( ) denotes a permutation index in the array of permutation indexes.

Example 137 includes the subject matter of Example 135 or 136, and optionally, wherein the array of permutation indexes, denoted idx, is defined as follows:

$$idx(j \times N_x + i) = N_y \times i + j, \text{ where}$$

$$i = 0, 1, \ldots, N_x - 1 \text{ and } j = 0, 1, \ldots, N_y - 1$$

$$x = \left( (N_{SD} + N_P) \times \sum_{i_{SS}=1}^{N_{SS_{user}}} N_{BPSC_{user},i_{SS}} \right) / L_{CW_{user}}$$

wherein:

$x < 2.5 \times N_{CB} : N_x = 2 \times N_{CB}$ $2.5 \times N_{CB} \leq x < 3.5 \times N_{CB} : N_x = 3 \times N_{CB}$ $3.5 \times N_{CB} \leq x < 5 \times N_{CB} : N_x = 4 \times N_{CB}$ $5 \times N_{CB} \leq x < 7 \times N_{CB} : N_x = 6 \times N_{CB}$ $7 \times N_{CB} \leq x < 10 \times N_{CB} : N_x = 8 \times N_{CB}$ $10 \times N_{CB} \leq x < 14 \times N_{CB} : N_x = 12 \times N_{CB}$ $14 \times N_{CB} \leq x < 20 \times N_{CB} : N_x = 16 \times N_{CB}$ $x \geq 20 \times N_{CB} : N_x = 24 \times N_{CB}$ wherein:

$N_y = (N_{SD} \pm N_P)/N_x$ wherein $N_{SD}$ denotes the count of data subcarriers per OFDM symbol, $N_{CB}$ denotes the count of 2.16 GHz channels in the channel bandwidth, $N_P$ denotes the count of the plurality of padded zeros, $N_{SS_{i_{user}}}$ denotes a count of spatial streams for an $i_{user}$-th user, $N_{BPSC_{i_{user},i_{SS}}}$ denotes a count of coded bits per constellation point for the $i_{user}$-th user and an $i_{SS}$-th spatial stream, and $L_{CW_{i_{user}}}$ denotes a low-density parity-check (LDPC) codeword length for the $i_{user}$-th user.

Example 138 includes the subject matter of any one of Examples 133-137, and optionally, wherein the plurality of symbols in the OFDM symbol data block comprise 16 Quadrature Amplitude Modulation (QAM) or 64-QAM symbols.

Example 139 includes the subject matter of any one of Examples 133-138, and optionally, comprising means for generating scrambled bits by scrambling data bits of the data field of the EDMG OFDM PPDU, and encoding the scrambled bits into encoded bits according to a low-density parity-check (LDPC) code.

Example 140 includes the subject matter of any one of Examples 133-139, and optionally, comprising means for spreading constellation points from the plurality of spatial streams into a plurality of space-time streams according to a Space Time Block Code (STBC).

Example 141 includes the subject matter of any one of Examples 133-140, and optionally, comprising means for building one or more Training (TRN) units of the EDMG OFDM PPDU.

Example 142 includes the subject matter of any one of Examples 133-141, and optionally, wherein the PPDU comprises a Single User (SU) PPDU.

Example 143 includes the subject matter of any one of Examples 133-141, and optionally, wherein the PPDU comprises a Multi User (MU) PPDU.

Example 144 includes the subject matter of Example 143, and optionally, comprising means for processing a plurality of EDMG PPDU portions of the EDMG MU PPDU to be transmitted to a respective plurality of users, mapping a plurality of scrambled and encoded spatial bit streams for a user into a respective plurality of spatial streams of constellation points for the user, interleaving constellation points in the plurality of spatial streams of constellation points for the user, and mapping to the plurality of transmit chains a plurality of user spatial streams, the plurality of user spatial streams comprising one or more spatial streams for each user of the plurality of users.

Example 145 includes the subject matter of Example 144, and optionally, wherein the plurality of scrambled and encoded spatial bit streams for the user are based on bits of an EDMG Header (EDMG Header B) for the user and a data field for the user.

Example 146 includes the subject matter of any one of Examples 133-145, and optionally, comprising means for transmitting the EDMG OFDM PPDU via the plurality of transmit chains in the channel bandwidth over a frequency band above 45 GHz.

Example 147 includes the subject matter of any one of Examples 133-146, and optionally, comprising means for transmitting the EDMG OFDM PPDU over a channel bandwidth of 2.16 GHz, 4.32 GHz, 6.48 GHz, or 8.64 GHz.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a transmitter comprising logic and circuitry configured to generate a transmission of a control mode Physical layer (PHY) Protocol Data Unit (PPDU) at an Enhanced Directional Multi-Gigabit (DMG) (EDMG) wireless communication station (STA), the transmitter comprising:
a Golay builder to build modulated Golay sequences of a non-EDMG Short Training Field (L-STF) and a non-EDMG Channel Estimation Field (L-CEF) of the control mode PPDU;
a scrambler to generate scrambled bits by scrambling bits of a non-EDMG header (L-header) and a data field of the control mode PPDU;
a Low-Density Parity-Check (LDPC) encoder to encode the scrambled bits into encoded bits according to an LDPC code;
a constellation mapper to map the encoded bits into constellation points;
a spreader to spread the constellation points according to a Golay sequence; and
a transmit chain mapper to map an encoded and modulated bit stream to a plurality of transmit chains by applying a spatial expansion with relative cyclic shift over the plurality of transmit chains, wherein the encoded and modulated bit stream comprises spread constellation points from the spreader and the modulated Golay sequences of the L-STF and L-CEF from the Golay builder.

2. The apparatus of claim 1 comprising a cyclic shifter to apply a Cyclic Shift Diversity (CSD) per transmit chain of the plurality of transmit chains.

3. The apparatus of claim 2, wherein the CSD is configured to prevent unintentional signal beamforming.

4. The apparatus of claim 1, wherein the Golay builder is configured to build modulated Golay sequences of Training (TRN) units of the control mode PPDU.

5. The apparatus of claim 1, wherein the control mode PPDU comprises a non-EDMG control mode PPDU configured for decoding by non-EDMG STAs, which are DMG STAs.

6. The apparatus of claim 5, wherein the Golay builder is configured to build modulated Golay sequences of Training (TRN) units of the non-EDMG control mode PPDU, and wherein the encoded and modulated bit stream comprises the modulated Golay sequences of the TRN units.

7. The apparatus of claim 1, wherein the control mode PPDU comprises an EDMG control mode PPDU comprising an EDMG Header A configured for decoding by EDMG STAs.

8. The apparatus of claim 7, wherein the scrambler is to generate the scrambled bits by scrambling bits of the EDMG Header A.

9. The apparatus of claim 7, wherein the Golay builder is configured to build modulated Golay sequences of Training (TRN) units of the EDMG control mode PPDU, and wherein each transmit chain of the plurality of transit chains is provided with its own TRN unit for transmission without the relative cyclic shift.

10. The apparatus of claim 1, wherein the Golay builder is configured to build the modulated Golay sequences comprising π/2 Binary Phase Shift Keying (BPSK) modulated Golay sequences.

11. The apparatus of claim 1, wherein the spreader is to spread out a constellation point of the constellation points to 32 chips by applying a Golay sequence Ga of length 32.

12. The apparatus of claim 1 comprising a pulse shaper configured to perform, in the plurality of transmit chains, convolution of constellation points with a shape filter impulse response.

13. The apparatus of claim 12, wherein the pulse shaper is configured to perform pulse shaping with a relative time delay between a primary channel and a secondary channel for a duplicate transmission.

14. The apparatus of claim 1 configured to transmit the control mode PPDU via the plurality of transmit chains in a channel bandwidth of at least 2.16 Gigahertz (GHz) over a frequency band above 45 GHz.

15. The apparatus of claim 14 configured to transmit the control mode PPDU over a channel bandwidth of 4.32 GHz, 6.48 GHz, or 8.64 GHz.

16. The apparatus of claim 1 comprising the plurality of transmit chains to transmit the transmission of the control mode PPDU.

17. The apparatus of claim 16 comprising a plurality of antennas connected to the plurality of transmit chains, a memory, and a processor to execute instructions of an Operating System (OS).

18. A product comprising one or more tangible computer-readable non-transitory storage media comprising computer-executable instructions operable to, when executed by at least one processor, enable the at least one processor to cause an Enhanced Directional Multi-Gigabit (DMG) (EDMG) wireless communication station (STA) to:
build modulated Golay sequences of a non-EDMG Short Training Field (L-STF) and a non-EDMG Channel Estimation Field (L-CEF) of a control mode Physical layer (PHY) Protocol Data Unit (PPDU);
generate scrambled bits by scrambling bits of a non-EDMG header (L-header) and a data field of the control mode PPDU;
encode the scrambled bits into encoded bits according to a Low-Density Parity-Check (LDPC) code;
map the encoded bits into constellation points;
spread the constellation points according to a Golay sequence to provide spread constellation points; and
map an encoded and modulated bit stream to a plurality of transmit chains by applying a spatial expansion with relative cyclic shift over the plurality of transmit chains, wherein the encoded and modulated bit stream comprises the spread constellation points and the modulated Golay sequences of the L-STF and L-CEF.

19. The product of claim 18, wherein the instructions, when executed, cause the EDMG STA to apply a Cyclic Shift Diversity (CSD) per transmit chain of the plurality of transmit chains.

20. The product of claim 18, wherein the control mode PPDU comprises a non-EDMG control mode PPDU configured for decoding by non-EDMG STAs, which are DMG STAs.

21. The product of claim 20, wherein the instructions, when executed, cause the EDMG STA to build modulated Golay sequences of Training (TRN) units of the non-EDMG control mode PPDU, and wherein the encoded and modulated bit stream comprises the modulated Golay sequences of the TRN units.

22. The product of claim 18, wherein the control mode PPDU comprises an EDMG control mode PPDU comprising an EDMG Header A configured for decoding by EDMG STAs.

23. The product of claim 22, wherein the instructions, when executed, cause the EDMG STA to build modulated Golay sequences of Training (TRN) units of the EDMG control mode PPDU, and to provide each transmit chain of the plurality of transit chains with its own TRN unit for transmission without the relative cyclic shift.

24. An apparatus comprising:
   means for generating at an Enhanced Directional Multi-Gigabit (DMG) (EDMG) wireless communication station (STA) an encoded and modulated bit stream by:
      building modulated Golay sequences of a non-EDMG Short Training Field (L-STF) and a non-EDMG Channel Estimation Field (L-CEF) of a control mode Physical layer (PHY) Protocol Data Unit (PPDU);
      generating scrambled bits by scrambling bits of a non-EDMG header (L-header) and a data field of the control mode PPDU;
      encoding the scrambled bits into encoded bits according to a Low-Density Parity-Check (LDPC) code;
      mapping the encoded bits into constellation points; and
      spreading the constellation points according to a Golay sequence to provide spread constellation points; and
   means for mapping the encoded and modulated bit stream to a plurality of transmit chains by applying a spatial expansion with relative cyclic shift over the plurality of transmit chains, wherein the encoded and modulated bit stream comprises the spread constellation points and the modulated Golay sequences of the L-STF and L-CEF.

25. The apparatus of claim 24 comprising means for applying a Cyclic Shift Diversity (CSD) per transmit chain of the plurality of transmit chains.

* * * * *